United States Patent
Yoshida

(10) Patent No.: US 9,065,250 B2
(45) Date of Patent: Jun. 23, 2015

(54) OPTICAL AMPLIFIER AND OPTICAL AMPLIFYING METHOD

(71) Applicant: Sony Corporation, Tokyo (JP)

(72) Inventor: Hiroshi Yoshida, Kanagawa (JP)

(73) Assignee: SONY CORPORATION (JP)

( * ) Notice: Subject to any disclaimer, the term of this patent is extended or adjusted under 35 U.S.C. 154(b) by 0 days.

(21) Appl. No.: 14/209,857

(22) Filed: Mar. 13, 2014

(65) Prior Publication Data

US 2014/0285876 A1 Sep. 25, 2014

(30) Foreign Application Priority Data

Mar. 25, 2013 (JP) ................................ 2013-062423

(51) Int. Cl.
| | | |
|---|---|---|
| H01S 5/10 | (2006.01) | |
| H01S 5/323 | (2006.01) | |
| H01S 5/50 | (2006.01) | |
| H01S 3/23 | (2006.01) | |
| H01S 5/065 | (2006.01) | |
| H01S 5/14 | (2006.01) | |

(52) U.S. Cl.
CPC ............ *H01S 5/1064* (2013.01); *H01S 5/1003* (2013.01); *H01S 3/2308* (2013.01); *H01S 5/0657* (2013.01); *H01S 5/1039* (2013.01); *H01S 5/1085* (2013.01); *H01S 5/14* (2013.01); *H01S 5/32341* (2013.01); *H01S 5/50* (2013.01)

(58) Field of Classification Search
CPC ..................................................... H01S 5/1003
USPC ......................................................... 359/344
See application file for complete search history.

(56) References Cited

U.S. PATENT DOCUMENTS

| | | | | |
|---|---|---|---|---|
| 5,260,822 A | * | 11/1993 | Missaggia et al. | 359/337 |
| 5,894,492 A | * | 4/1999 | Welch et al. | 372/50.1 |
| 5,936,991 A | * | 8/1999 | Lang et al. | 372/50.22 |
| 6,137,625 A | * | 10/2000 | Salet et al. | 359/344 |
| 6,836,499 B2 | * | 12/2004 | Capasso et al. | 372/50.22 |
| 2002/0131746 A1 | * | 9/2002 | Bayramian et al. | 385/131 |
| 2010/0158443 A1 | * | 6/2010 | Jeong | 385/50 |

FOREIGN PATENT DOCUMENTS

JP    2012-248745 A    12/2012

OTHER PUBLICATIONS

Balzer et al., "All semiconductor high power fs laser system with variable repetition rate", Ruhr-Universitat Bochum, Photonics West 2012, Paper 8277-39, 2012, 22 pages.

* cited by examiner

*Primary Examiner* — Mark Hellner
(74) *Attorney, Agent, or Firm* — Sheridan Ross P.C.

(57) ABSTRACT

There is provided an optical amplifier including a diffusing unit configured to be driven by a first current density and to increase a beam diameter of an incident laser beam that passes through a first waveguide that guides the laser beam, and an amplifying unit configured to be driven by a second current density that is higher than the first current density and to amplify intensity of the laser beam that passes through a second waveguide that guides the laser beam whose beam diameter has been increased by the diffusing unit. The first waveguide of the diffusing unit has a tapered shape in which a cross-sectional area of the first waveguide is gradually increased toward a travelling direction of the laser beam.

12 Claims, 21 Drawing Sheets

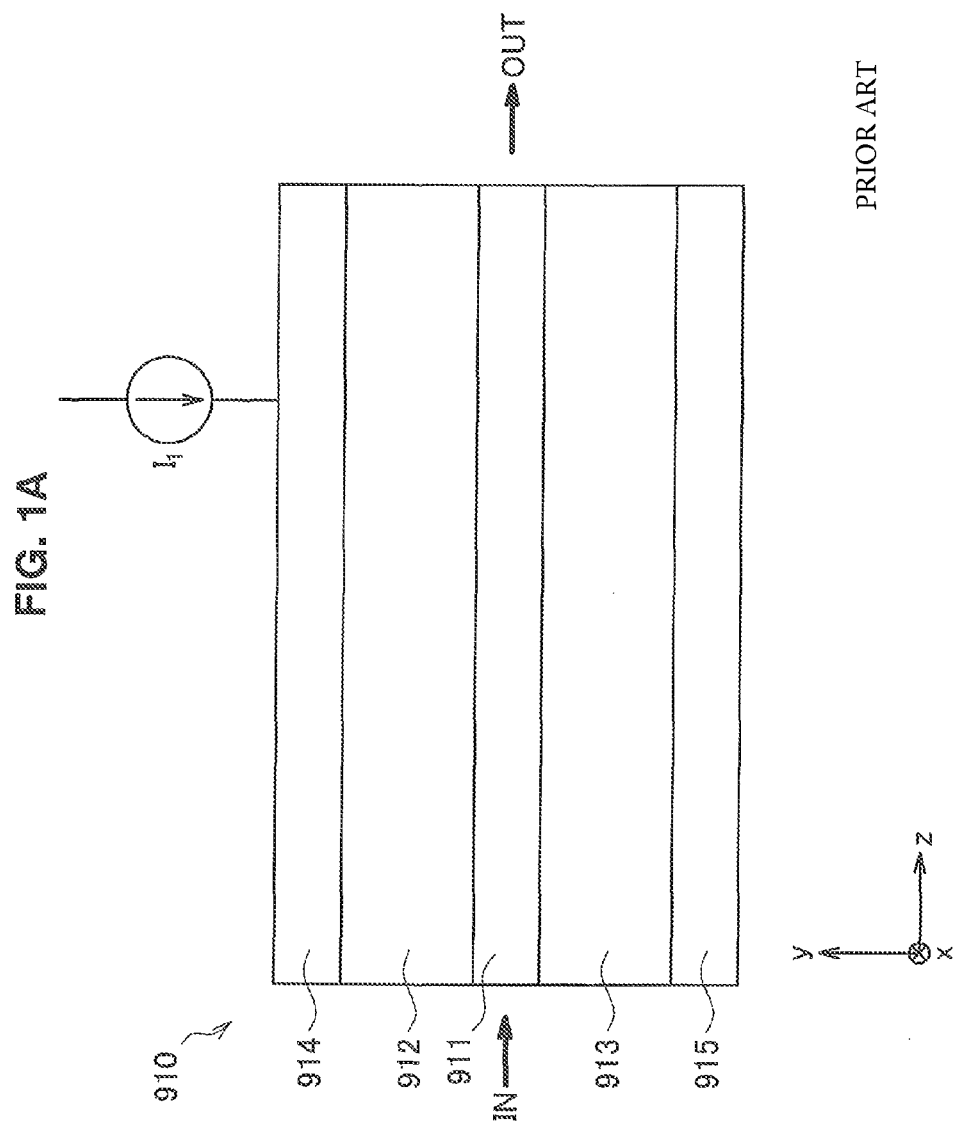

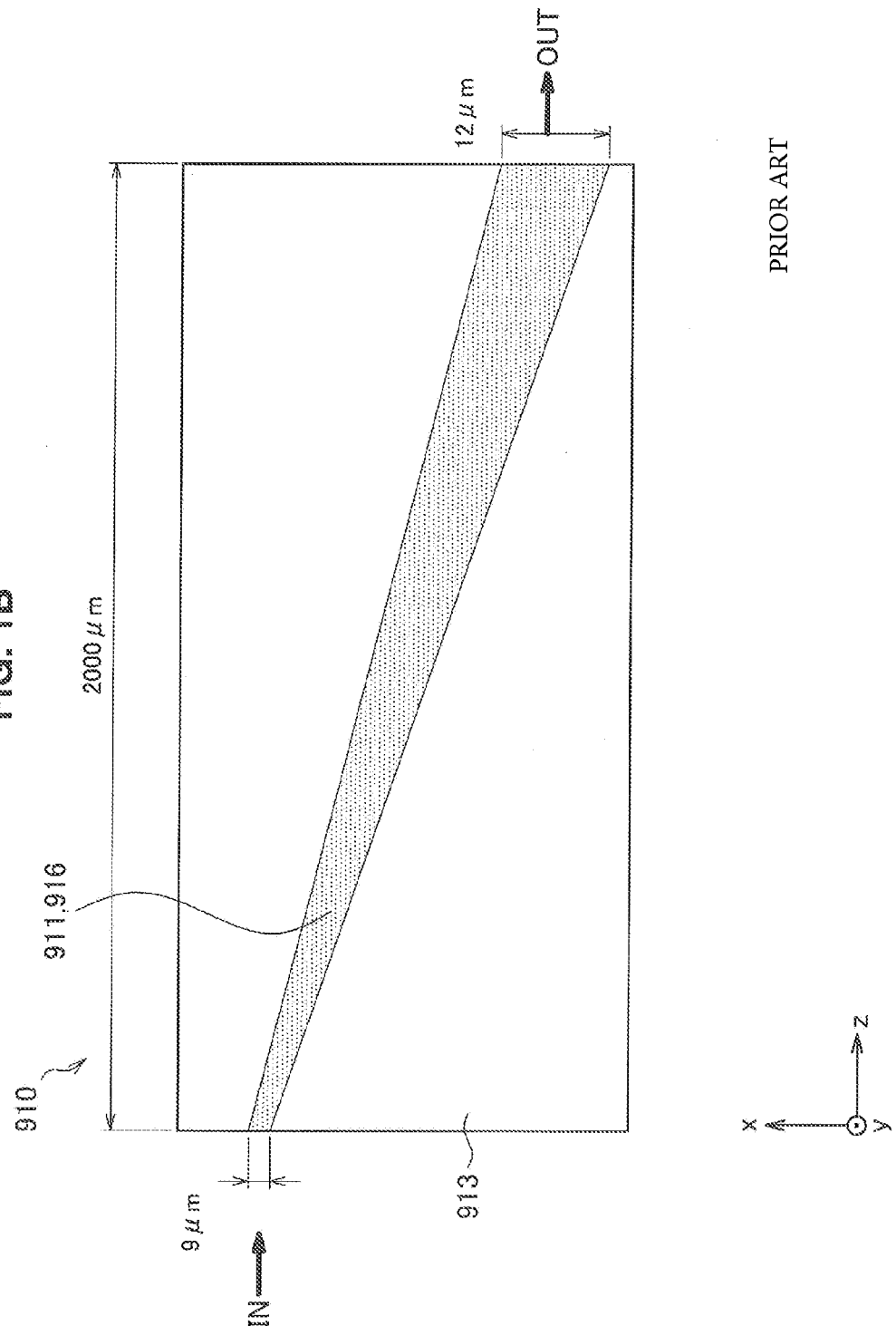

PRIOR ART

PRIOR ART

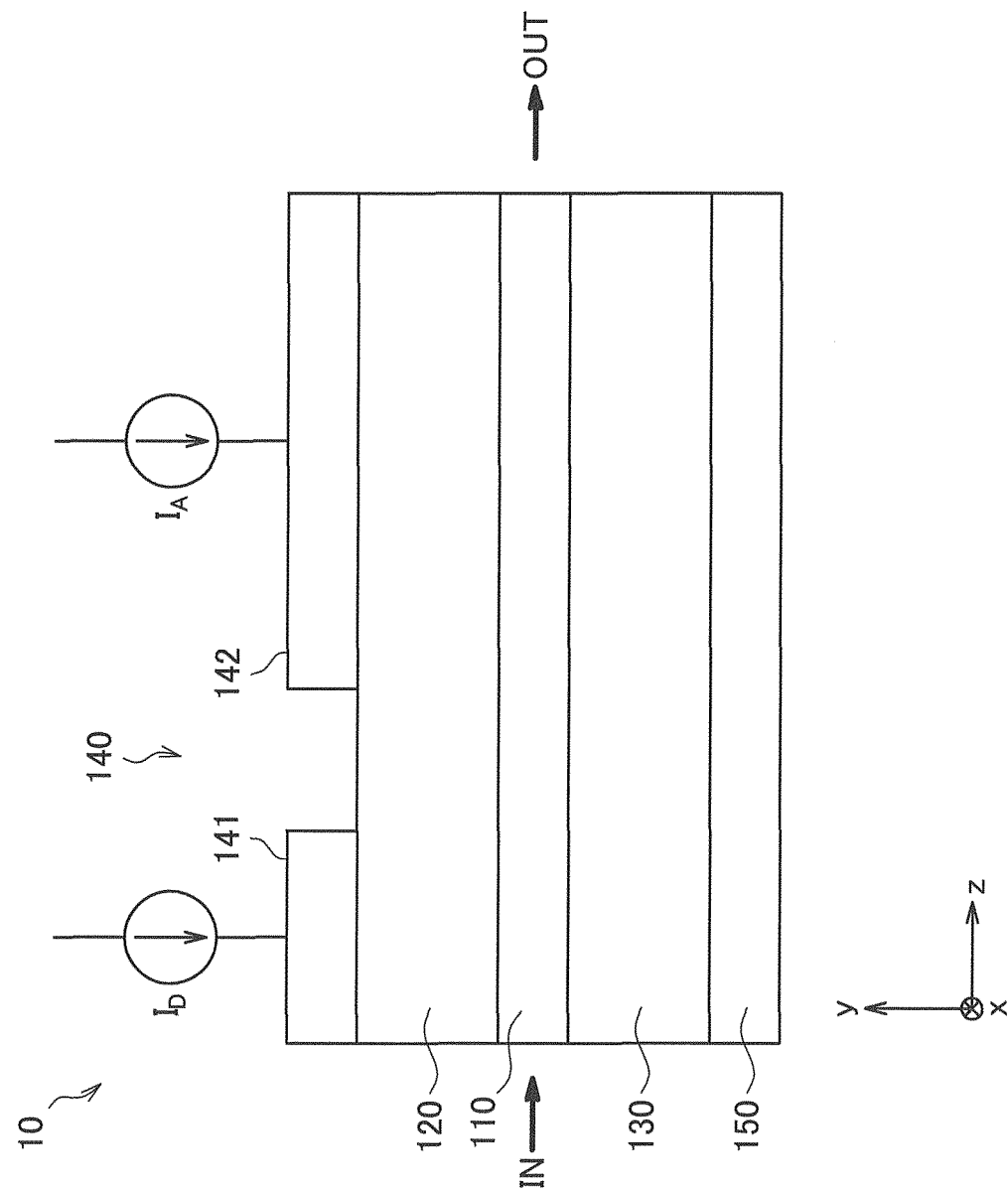

SMALL ⟵⟶ LARGE

SMALL ⟵⟶ LARGE

FIG. 12

| $J_A$(kA/cm²) | $L_A$(μm) | AMPLIFYING RATE Exp(0.62g$L_A$) | | | | | | | | | |
|---|---|---|---|---|---|---|---|---|---|---|---|
| 6.5 | 1750 | 107 | $W_{out-dif}$(μm) | 1.5 | 3.0 | 15 | 30 | 45 | 60 |
| | | | $θ_{min}$(deg) | 2.89 | 4.66 | 4.47 | 4.22 | 3.98 | 3.73 |
| 6.0 | 1750 | 107 | $W_{out-dif}$(μm) | 1.5 | 3.0 | 15 | 30 | 45 | 60 |
| | | | $θ_{min}$(deg) | 2.60 | 2.58 | 2.38 | 2.14 | 1.89 | 1.65 |
| 5.5 | 2000 | 107 | $W_{out-dif}$(μm) | 1.5 | 3.0 | 15 | 30 | 45 | 60 |
| | | | $θ_{min}$(deg) | 2.28 | 2.26 | 2.08 | 1.87 | 1.66 | 1.44 |
| 5.0 | 2300 | 100 | $W_{out-dif}$(μm) | 1.5 | 3.0 | 15 | 30 | 45 | 60 |
| | | | $θ_{min}$(deg) | 1.85 | 1.83 | 1.68 | 1.50 | 1.31 | 1.12 |
| 4.0 | 3500 | 107 | $W_{out-dif}$(μm) | 1.5 | 3.0 | 15 | 30 | 45 | 60 |
| | | | $θ_{min}$(deg) | 1.30 | 1.29 | 1.19 | 1.07 | 0.95 | 0.82 |

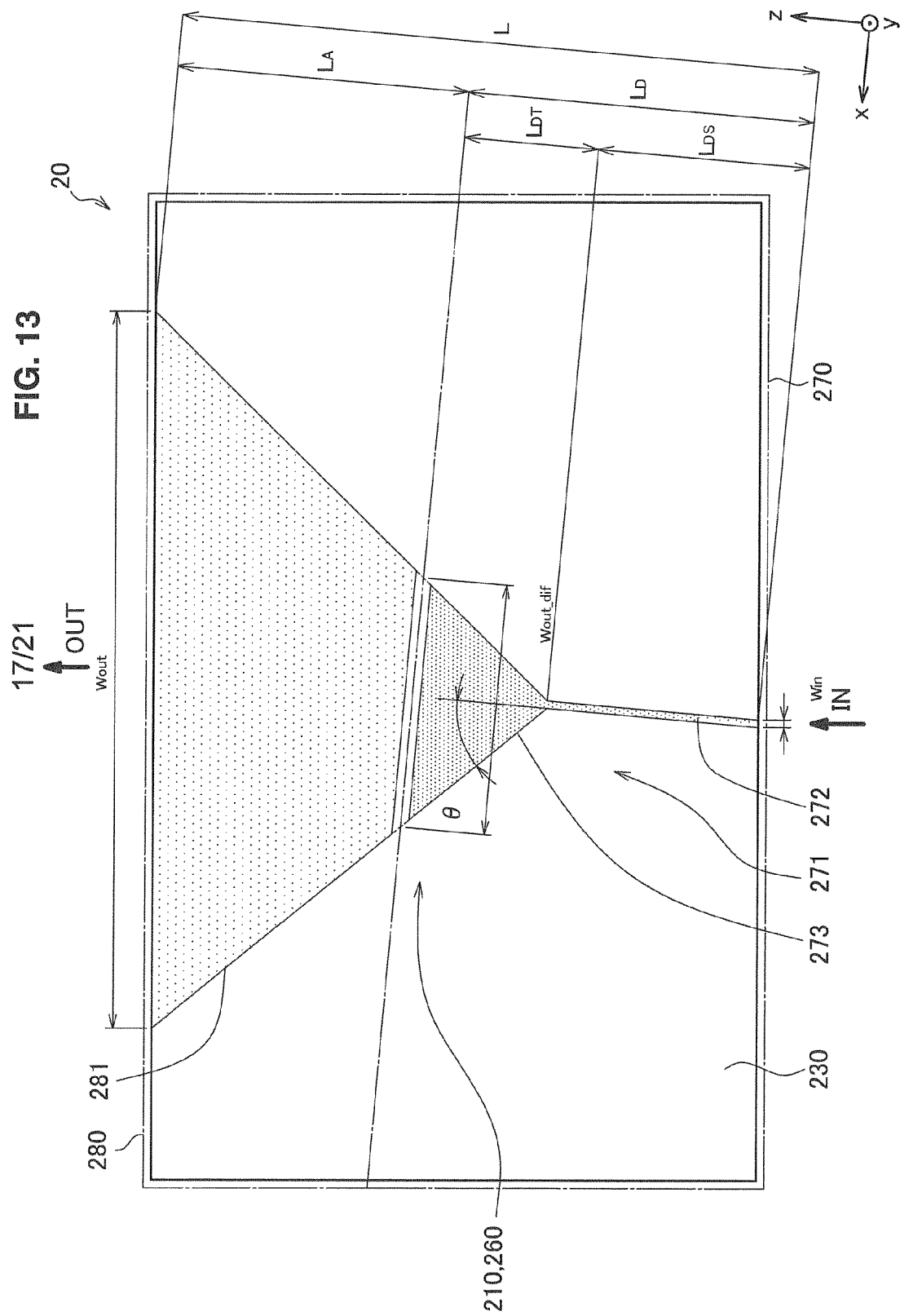

OPTICAL AMPLIFIER AND OPTICAL AMPLIFYING METHOD

CROSS REFERENCE TO RELATED APPLICATIONS

This application claims the benefit of Japanese Priority Patent Application JP 2013-062423 filed Mar. 25, 2013, the entire contents of which are incorporated herein by reference.

BACKGROUND

The present disclosure relates to an optical amplifier and an optical amplifying method.

In the optical engineering field, as a device that amplifies intensity of a laser beam, a semiconductor optical amplifier (SOA) has attracted attention. The SOA is a device having a structure similar to that of a laser diode (LD) and causes stimulated emission in a semiconductor layer with a laser beam incident on the semiconductor layer that is made in an inverted distribution state by supplying predetermined current, and amplifies the intensity of the laser beam.

In recent years, SOAs having a variety of structures have been developed so as to increase performance thereof. For example, Jan C. Balzer et al., Photonics West 2012, USA, Paper 8277-39, disclose an SOA that amplifies a pulse-oscillated laser beam (pulsed laser beam), in which electrodes for supplying current are divided into two parts and current having different values is supplied to the respective two parts of the electrodes, so that pulse frequency of the pulsed laser beam is adjusted in a region corresponding to a former-stage electrode and the intensity of the pulsed laser beam is amplified in a region corresponding to a latter-stage electrode.

Meanwhile, in the optical recording field using a laser beam, a laser beam with a relatively high output, for example, having peak power of about 100 W, is required. Accordingly, for a laser beam having a blue wavelength band of about 405 (nm) for example, an SOA aiming to output such a laser beam with a relatively high output more stably has been developed. For example, JP 2012-248745A discloses a light source apparatus having an SOA, which adjusts a cross-sectional area of a waveguide of the SOA and changes the magnification of a laser beam (incident light) that is incident on a former stage of the SOA, thereby making only one peak appear in the laser beam that is finally output and suppressing variations in the peak position.

SUMMARY

Here, in the optical imaging field using a laser beam, a laser beam having peak power that is higher than the above-described peak power, which is about 100 W, is required as the intensity of the laser beam. However, when the peak power is increased in the structure in JP 2012-248745A, the following phenomenon has been confirmed: the width of the laser beam (beam width) on a horizontal plane at an emission end of the SOA becomes narrower (narrowing occurs) than the width of the corresponding waveguide. Such narrowing of the beam width at the emission end of the SOA may disadvantageously cause catastrophic optical damage (COD), a decrease in the efficiency of light amplification (optical amplifying efficiency), and the like.

Thus, it has been demanded for an SOA to increase the peak power of the output laser beam (emission light) and suppress narrowing of the beam width. Accordingly, the present disclosure proposes a novel and improved optical amplifier and optical amplifying method that can further suppress narrowing of the beam width.

According to an embodiment of the present disclosure, there is provided an optical amplifier including a diffusing unit configured to be driven by a first current density and to increase a beam diameter of an incident laser beam that passes through a first waveguide that guides the laser beam, and an amplifying unit configured to be driven by a second current density that is higher than the first current density and to amplify intensity of the laser beam that passes through a second waveguide that guides the laser beam whose beam diameter has been increased by the diffusing unit. The first waveguide of the diffusing unit has a tapered shape in which a cross-sectional area of the first waveguide is gradually increased toward a travelling direction of the laser beam.

According to another embodiment of the present disclosure, there is provided an optical amplifying method including increasing a beam diameter of an incident laser beam that passes through a first waveguide that guides the laser beam, by applying a first current density to the first waveguide, and amplifying intensity of the laser beam that passes through a second waveguide that guides the laser beam whose beam diameter has been increased, by applying, to the second waveguide, a second current density that is higher than the first current density. The first waveguide has a tapered shape in which a cross-sectional area of the first waveguide is gradually increased toward a travelling direction of the laser beam.

According to one or more of embodiments of the present disclosure, the diffusing unit increases the beam diameter of the laser beam, and the amplifying unit amplifies the intensity of the laser beam having the beam diameter that has been increased by the diffusing unit. Therefore, narrowing of a laser width is more suppressed.

As described above, according to one or more of the embodiments of the present disclosure, it is possible to further suppress narrowing of the laser width.

BRIEF DESCRIPTION OF THE DRAWINGS

FIG. 1A is a schematic diagram showing one structural example of an existing SOA;

FIG. 1B is a schematic diagram showing one structural example of an existing SOA;

FIG. 4A is a schematic diagram showing one structural example of an SOA according to an embodiment of the present disclosure;

FIG. 12 is a table showing examples of parameters for designing a shape of a waveguide in an SOA according to an embodiment;

FIG. 13 is a schematic diagram showing a structure of an SOA according to one modification example of an embodiment;

DETAILED DESCRIPTION OF THE EMBODIMENT(S)

Figure 2:
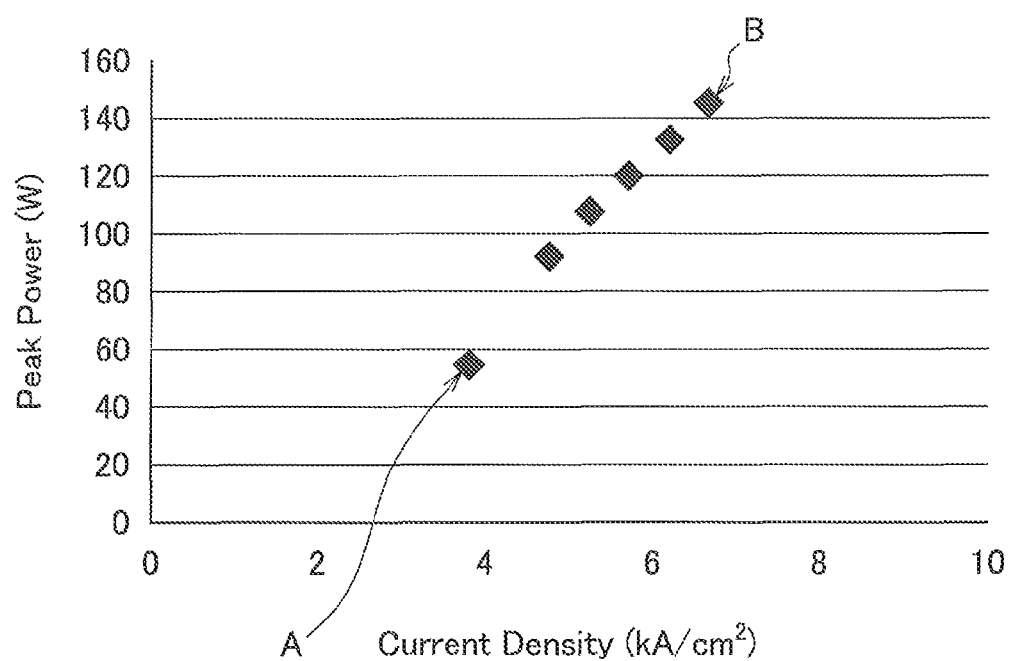
FIG. 2 is a graph showing a relation between a current density in an active layer in an existing SOA and a peak power of emitted light.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the appended drawings may exaggerate sizes of some structural members or show a large/small relation of the structural members in a ratio different from the actual ratio for easy understanding of the embodiments. Therefore, geometric sizes, vertical and horizontal ratios, and the like of the structural members in the appended drawings do not show strictly reduced or enlarged actual structures.

Further, the description will be made in the following order.
1. Study on existing SOA
2. Embodiment of present disclosure
3. Discussion on SOA according to embodiment
 3-1. SOA for testing
 3-2. Optical propagation simulation
 3-3. Results of optical propagation simulation
4. Method for designing SOA
 4-1. Diffusion in waveguide formed using transparent medium
 4-2. Diffusion in waveguide formed using amplifying medium
 4-3. Diffusion in tapered waveguide formed using amplifying medium
5. Modification example and application example
 5-1. Structure having different taper angles
 5-2. Application to MOPA
6. Conclusion <1 Study on Existing SOA>

Prior to a description of preferred embodiments of the present disclosure, in order to make content of the present disclosure more precise, a structure of an existing optical amplifier will be described first. Here, results of the present inventor's study on the existing optical amplifier and backgrounds of the present disclosure made by the present inventor will be described.

As one structural example of the existing optical amplifier, one structural example of an existing semiconductor optical amplifier (SOA) will be described with reference to FIGS. 1A and 1B. FIGS. 1A and 1B are each a schematic diagram showing the structural example of the existing SOA. Note that FIG. 1A schematically shows a cross-sectional view of the existing SOA taken along a plan along an optical path of a laser beam and along a direction in which semiconductor layers are stacked, and FIG. 1B schematically shows a structure of the existing SOA when seen from a top of the direction in which the semiconductor layers are stacked. Here, the SOA shown in FIGS. 1A and 1B corresponds to the SOA disclosed in JP 2012-248745A, for example. Note that in the following description, a z-axis is defined as follows: a direction in which the laser beam is incident on the SOA is defined as a negative direction of the z-axis, and a direction in which the laser beam is emitted from the SOA is defined as a positive direction of the z-axis. In FIG. 1A, the left direction in the drawing corresponds to the negative direction of the z-axis and the right direction in the drawing corresponds to the positive direction of the z-axis. Further, in order to describe a positional relation between structural members of the SOA, in a travelling direction of the laser beam that passes through the SOA (i.e., the z-axis direction), an upper stream side may be referred to as a former stage, and a lower stream side may be referred to as a latter stage.

Referring to FIG. 1A, an SOA 910 has a stack structure in which an active layer 911 is interposed between a p-type cladding layer 912 and an n-type cladding layer 913. Note that although not shown in FIG. 1A, each of the n-type cladding layer 913, the active layer 911, and the p-type cladding layer 912 may be stacked over a variety of substrates such as a Si substrate. Note that main materials for the active layer 911, the p-type cladding layer 912, and the n-type cladding layer 913 may be selected as appropriate depending on a wavelength of a laser beam that the SOA 910 amplifies. For example, as the main materials for the active layer 911, the p-type cladding layer 912, and the n-type cladding layer 913, III-V semiconductors such as GaN, GaAs, GaInN and/or AlGaAs are mainly used. For example, when the light incident on the SOA 910 is a blue laser beam (a laser beam having a wavelength band of about 350 nm to about 500 nm, for example), a compound semiconductor containing GaInN as a main component may be used for the active layer 911, the p-type cladding layer 912, and the n-type cladding layer 913.

Over a top surface of the p-type cladding layer 912 in the stacking direction, an upper electrode 914 is provided. Further, below a bottom surface of the n-type cladding layer 913 in the stacking direction, a lower electrode 915 is provided. Furthermore, in an end surface where the laser beam is incident on the SOA 910 (an incident end, or an end surface in the positive direction of the z-axis shown in FIG. 1A) and an end surface where the laser beam is emitted (an emission end, or an end surface in the positive direction of the z-axis shown in FIG. 1A), at least in a region corresponding to an end surface of the active layer 911, anti-reflection (AR) coating (not shown) is provided in order to suppress the reflection of the laser beam on the end surface.

Note that in the following description, as shown in FIG. 1A, with respect to the SOA 910, a direction in which the n-type cladding layer 913, the active layer 911, and the p-type cladding layer 912 are stacked is defined as a positive direction of a y-axis, and the y-axis direction is also referred to as a vertical direction. Further, a direction that is vertical to the y-axis and the z-axis is defined as an x-axis, and the x-axis direction is also referred to as a left and right direction. Note that in the left and right direction to the direction (the positive direction of the z-axis direction) in which the laser beam is emitted from the SOA 910, the left direction is defined as a positive direction of the x-axis.

When the SOA 910 amplifies the laser beam, in a state where the lower electrode 915 is kept at a constant potential (e.g., a ground potential), predetermined current $I_1$ is supplied to the upper electrode 914, so that a predetermined current density is generated in the active layer 911 and a so-called inverted distribution state is generated. In this state, the laser beam is made incident on the active layer 911, so that stimulated emission occurs in the active layer 911 and the intensity of the incident laser beam is amplified. In this manner, in the SOA 910, the active layer 911 plays a role as a waveguide that guides the laser beam from the incident end to the emission end while amplifying the intensity of the laser beam. Here, in the left and right direction of the active layer 911 shown in FIG. 1A, insulating layers (not shown) are further provided using a variety of materials for example, and a cross-sectional shape of the active layer 911 is adjusted on a plane (an x-y plane) regulated by the x-axis and the y-axis by the p-type cladding layer 912 and the n-type cladding layer 913 over and below the active layer 911 and the insulating layers in the left and right direction. In this manner, a waveguide is formed by the active layer 911, the p-type cladding layer 912, the n-type cladding layer 913, and the peripheral insulating layers, and the p-type cladding layer 912, the n-type cladding layer 913, and the peripheral insulating layers are to be called optical guide layers. Note that in the following description, unless otherwise specified, the waveguide in the SOA means the active layer. Further, in the following description, unless otherwise specified, a cross section of the waveguide in the SOA means a cross section of the active layer on the x-y plane.

Referring to FIG. 1B, a shape of a waveguide 916 of the SOA 910 will be described. FIG. 1B is a schematic drawing showing a state of the existing SOA 910 when seen from the positive direction of the y-axis. However, in FIG. 1B, in order to describe the shape of the waveguide 916, only the n-type cladding layer 913 and the active layer 911 (i.e., the waveguide 916) are shown out of structural members of the SOA 910. Further, in FIG. 1B, the active layer 911 (the waveguide 916) is shown by hatching. Note that in the example shown in FIG. 1B, the active layer 911 (the waveguide 916) is stacked with a constant thickness with respect to the y-axis direction. Therefore, in the following description, unless otherwise specified, the shape of the waveguide 916 means the shape of the waveguide 916 on the plane (an x-z plane) regulated by the x-axis and the z-axis.

Referring to FIG. 1B, the waveguide 916 in the SOA 910 has a tapered shape in which the cross-sectional area thereof is gradually increased from the incident end toward the emission end. The length of the waveguide 916 in the x-axis direction (hereinafter also referred to as a width of the waveguide or a waveguide width) on the cross section at the incident end is about 9 μm for example, and the width of the waveguide 916 on the cross section at the emission end is about 12 μm for example. Further, the length of the SOA 910 in the z-axis direction (hereinafter also referred to as a length of the waveguide or a waveguide length) is about 2000 μm for example.

Figure 3A:
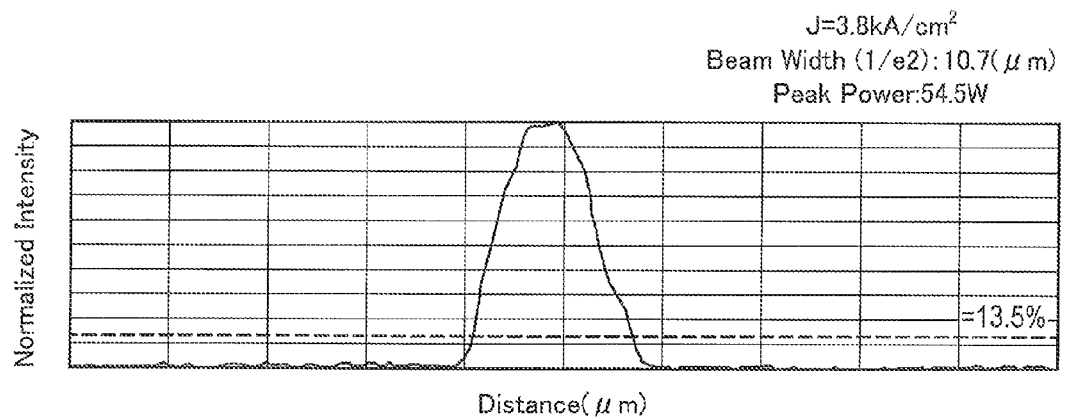
FIG. 3A is a graph showing intensity distribution of emitted light from an existing SOA corresponding to a point A shown in FIG. 2.
Figure 3B:
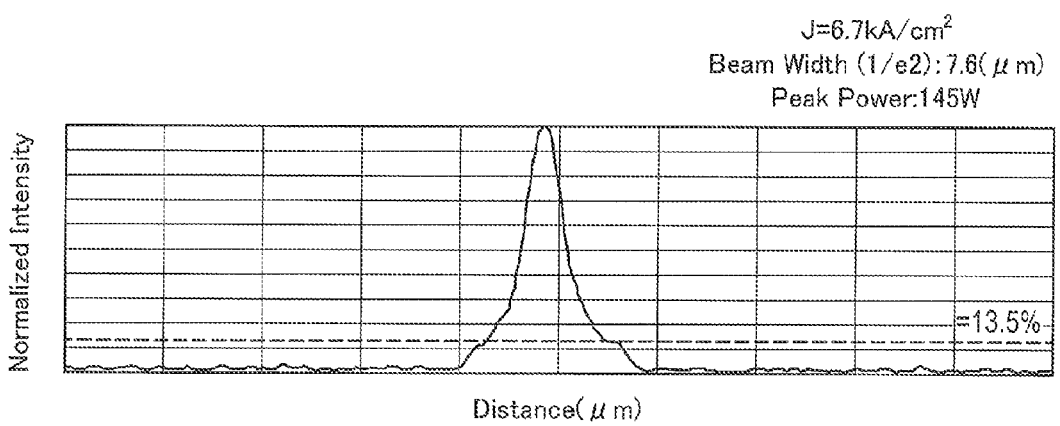
FIG. 3B is a graph showing intensity distribution of emitted light from an existing SOA corresponding to a point B shown in FIG. 2.

The present inventor has measured intensity distribution of emitted light from the SOA 910 shown in FIGS. 1A and 1B while changing the value of the supplied current $I_1$ in order to confirm performance of the existing SOA. FIGS. 2, 3A, and 3B show measurement results of the SOA 910. Note that in the following description, a width of the laser beam in the x-axis direction is referred to as a beam width of the laser beam. More specifically, when the intensity distribution of the laser beam in the x-axis direction is shown, the width of the laser beam at a point where the intensity of the laser beam becomes 1/e2 (13.5%) of the peak power is referred to as the beam width of the laser beam. Note that in FIGS. 3A and 3B and also in FIGS. 5, 7A, and 7B, which will be described later, a specific value of the beam width shown as a measured value is a value of the beam width at the emission end, and is a value obtained by converting the value of the beam width at 1/e2 of the measured intensity distribution into the beam width at the emission end based on the ratio between the value of the beam width read from the intensity distribution of emitted light in amplified spontaneous emission (ASE) and the waveguide width at the emission end. Note that the results shown in FIGS. 2, 3A, and 3B are results when the wavelength of the laser beam is about 405 nm.

FIG. 2 is a graph showing a relation between the current density in the active layer 911 in the existing SOA 910 and the peak power of emitted light. In FIG. 2, the horizontal axis represents the current density (Current Density ($kA/cm^2$)) in the active layer 911 and the vertical axis represents the peak power (Peak Power (W)) of emitted light from the SOA 910, and a relation between the current density and the peak power when the value of the supplied current $I_1$ is changed is plotted. Referring to FIG. 2, it is found that as the current density in the active layer 911 is increased, the peak power is proportionally increased. That is, by increasing the current density in the active layer 911 by increasing the value of the supplied current $I_1$, the amplifying rate of the intensity of the laser beam in the SOA 910 is increased and a laser beam having a higher peak power can be emitted.

Meanwhile, FIGS. 3A and 3B are graphs showing intensity distributions of emitted light from the existing SOA 910 corresponding to a point A and a point B shown in FIG. 2, respectively. In each of FIGS. 3A and 3B, the horizontal axis represents a distance in the x-axis (Distance (μm)), the vertical axis represents normalized intensity of emitted light from the SOA 910, and intensity distributions of emitted light from the SOA 910 in the x-axis direction are plotted. Note that in each of FIGS. 3A and 3B, in order to show the beam width, a broken line is shown at a height where the intensity of emitted light becomes 13.5% of the peak power.

Referring to FIG. 3A, at the point A in FIG. 2, the current density is J=3.8 (kA/cm$^2$), and in this case, the peak power of emitted light is 54.5 (W) and the beam width at the emission end is 10.7 (μm). Referring to FIG. 3B, at the point B in FIG. 2, the current density is J=6.7 (kA/cm$^2$), and in this case, the peak power of emitted light is 145 (W) and the beam width at the emission end is 7.6 (μm).

The results in FIGS. 3A and 3B show that the peak power can be amplified by increasing the current density in the active layer 911 in the existing SOA 910, but the beam width is narrowed. For example, under the condition shown in FIG. 3B, the beam width at the emission end is 7.6 (μm), which is narrower than the width of the waveguide 916 at the incident end (about 9 μm), far from the width of the waveguide 916 at the emission end (about 12 μm). Such narrowing of the beam width is considered to be generated by converging (focusing) of the laser beam (converging phenomenon (focusing phenomenon)) due to a change in the refractive index of a medium in the active layer 911 in accordance with the intensity of light. Note that the converging phenomenon will be explained in detail in <3. Discussion on SOA according to embodiment> below.

Further, the results in FIG. 3B show that the beam width is not increased in the existing SOA 910 even when the taper angle of the tapered shape in FIG. 1B is increased. Therefore, it is estimated that when the current density is made much higher than the condition (J=6.7 (kA/cm$^2$)) shown in FIG. 3B in order to amplify the peak power in the SOA 910, narrowing of the beam width will become more obvious and a decrease in amplifying rate or a problem of COD or the like will become apparent. In this manner, with the SOA 910 having an existing structure, it is considered that there is a limit on amplification of the intensity of the laser beam.

As one example of the existing optical amplifier, the structure and performance of the SOA 910 have been described above with reference to FIGS. 1A, 1B, 2, 3A, and 3B. As described above, with the SOA 910 having the existing structure, the beam width becomes narrower as the peak power is amplified, and accordingly, it is difficult to stably emit the laser beam having a peak power of about 150 W or higher, for example. However, in a field in which a laser beam of a relatively high output is required, such as the laser imaging field, a laser beam having a peak power of about 300 W or higher, for example, may be required. It can be said that the existing SOA 910 has difficulty in meeting such a demand that the peak power of the laser beam is amplified to such high intensity.

The present inventor has studied an optical amplifier that can further increase the peak power of emitted light and can suppress narrowing of the beam width based on the above results of study, and have arrived the following semiconductor optical amplifier (SOA) according to an embodiment of the present disclosure. One of preferred embodiments of the optical amplifier that the present inventor has arrived from this study will specifically be described below. Note that in the following embodiment, one structural example of the SOA corresponding to a blue laser beam (e.g., a laser beam having a wavelength band of about 350 nm to about 500 nm), in particular, a laser beam having a wavelength of about 405 (nm), will be shown. However, the SOA according to this embodiment is not limited to this example, and can be applied to a laser beam having other wavelength regions.

<2. Embodiment of Present Disclosure>

Figure 4B:
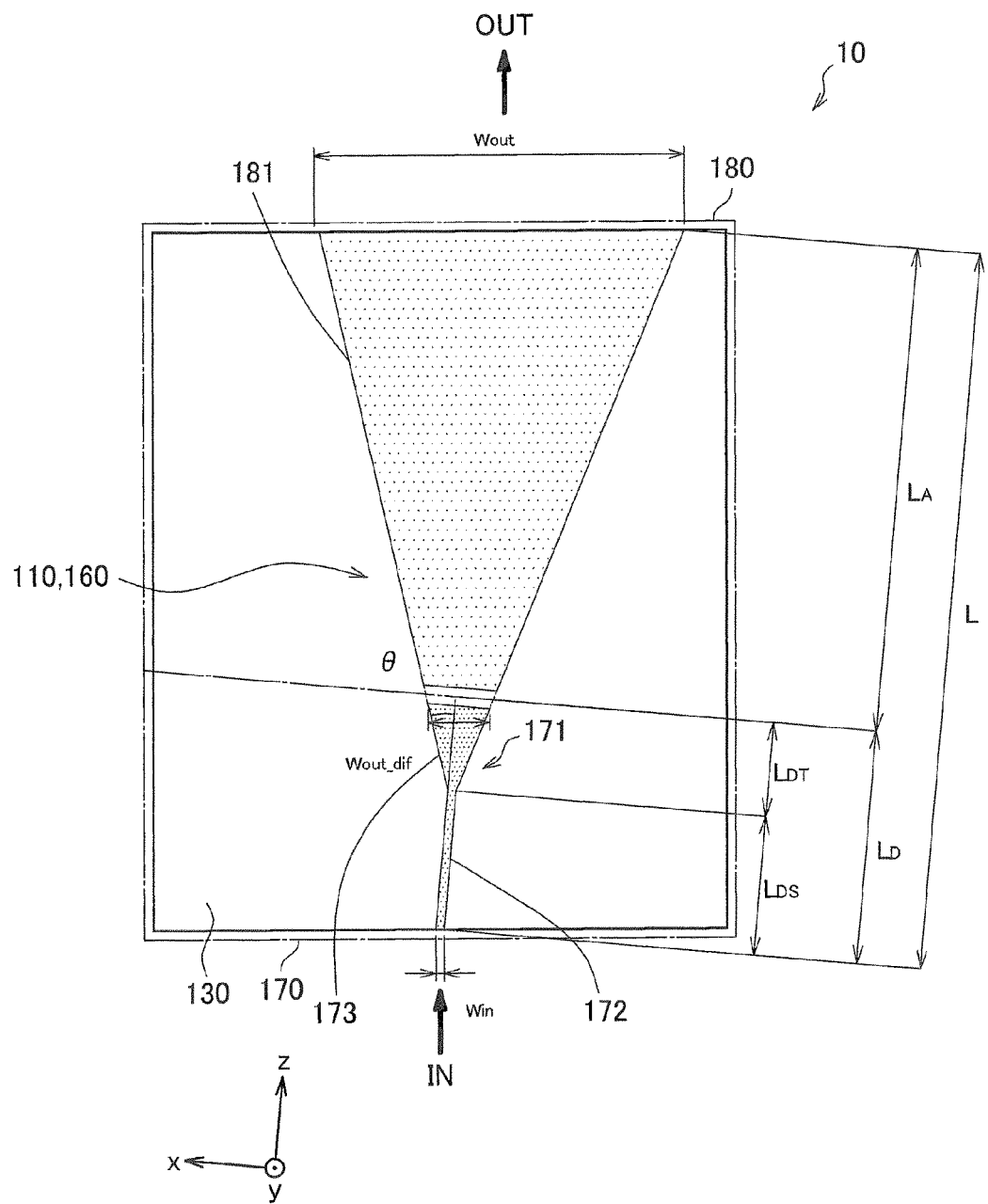
FIG. 4B is a schematic diagram showing one structural example of an SOA according to an embodiment of the present disclosure.

One structural example of a semiconductor optical amplifier (SOA) according to an embodiment of the present disclosure will be described with reference to FIGS. 4A and 4B. FIGS. 4A and 4B are each a schematic diagram showing the structural example of the SOA according to an embodiment of the present disclosure. Note that FIG. 4A schematically shows a cross-sectional view of the SOA according to this embodiment taken along a plane along an optical path of a laser beam and along s plane along a direction in which semiconductor layers are stacked, and FIG. 4B schematically shows a structure of the SOA according to this embodiment when seen from a top of the direction in which the semiconductor layers are stacked. Further, an x-axis, a y-axis, and a z-axis shown in FIGS. 4A and 4B represent the same coordinate axes as the x-axis, the y-axis, and the z-axis shown in FIGS. 1A and 1B.

Referring to FIG. 4A, an SOA 10 according to an embodiment of the present disclosure has a stack structure in which an active layer 110 is interposed between a p-type cladding layer 120 and an n-type cladding layer 130. Note that although not shown in FIG. 4A, each of the n-type cladding layer 130, the active layer 110, and the p-type cladding layer 120 may be stacked over a variety of substrates such as a Si substrate. For example, as the main materials for the active layer 110, the p-type cladding layer 120, and the n-type cladding layer 130, III-V semiconductors such as GaN, GaAs, GaInN, and/or AlGaAs are mainly used. For example, in the example shown in FIGS. 4A and 4B, a compound semiconductor containing GaInN as a main component is used for the active layer 110, the p-type cladding layer 120, and the n-type cladding layer 130 in order that the SOA 10 amplifies a blue laser beam. Note that in this embodiment, there is no particular limitation on a wavelength of the laser mean that the SOA 10 amplifies, and a laser beam having any wavelength can be used. The main materials for the active layer 110, the p-type cladding layer 120, and the n-type cladding layer 130 may be selected as appropriate depending on the wavelength of the laser beam that the SOA 10 amplifies.

Over a top surface of the p-type cladding layer 120 in the stacking direction, an upper electrode 140 is provided. Further, below a bottom surface of the n-type cladding layer 130 in the stacking direction, a lower electrode 150 is provided. Furthermore, in an incident end (an end surface in the positive direction of the z-axis shown in FIG. 4A) and an emission end (an end surface in the positive direction of the z-axis shown in FIG. 4A) of the SOA 10, at least in a region corresponding to an end surface of the active layer 110, anti-reflection (AR) coating (not shown) is provided in order to suppress the reflection of the laser beam on the end surfaces.

In addition, as shown in FIG. 4A, the upper electrode 140 is divided into two regions in the z-axis direction. In this manner, the upper electrode 140 includes a diffusing unit upper electrode 141 provided in a former stage in the direction in which the laser beam passes and an amplifying unit upper electrode 142 provided in a latter stage. Current having different values can be supplied to the diffusing unit upper electrode 141 and the amplifying unit upper electrode 142. Hereinafter, the current supplied to the diffusing unit upper electrode 141 may also be referred to as diffusing unit supplied current and represented by $I_D$. Further, the current supplied to the amplifying unit upper electrode 142 may also be referred to as amplifying unit supplied current and represented by $I_A$.

Here, when the SOA 10 amplifies the laser beam, in a state where the lower electrode 150 is kept at a constant potential (e.g., a ground potential), predetermined current is supplied to the upper electrode 140, so that a predetermined current density is generated in the active layer 110 and a so-called inverted distribution state is generated. In this state, the laser beam is made incident on the active layer 110, so that stimulated emission occurs in the active layer 110 and the intensity of the incident laser beam is amplified. In this embodiment, as described above, the upper electrode 140 is divided into the diffusing unit upper electrode 141 and the amplifying unit upper electrode 142, and different current $I_D$ and $I_A$ can be supplied thereto. Therefore, it is possible to control different values of the current density in the region of the active layer 110 right below the diffusing unit upper electrode 141 and the region of the active layer 110 right below the amplifying unit upper electrode 142. In this embodiment, in the SOA 10, the region where the current density is controlled by the current $I_D$ supplied to the diffusing unit upper electrode 141 is referred to as a diffusing unit and the region where the current density is controlled by the current $I_A$ supplied to the amplifying unit upper electrode 142 is referred to as an amplifying unit. The diffusing unit and the amplifying unit correspond to a diffusing unit 170 and an amplifying unit 180 that will be described later with reference to FIG. 4B. Note that in the following description, the current density in the active layer 110 in the diffusing unit is also referred to as a diffusing unit current density or a first current density, and represented by $J_D$. Further, the current density in the active layer 110 in the amplifying unit is also referred to as an amplifying unit current density or a second current density, and represented by $J_A$.

In this manner, in the SOA 10, the active layer 110 plays a role as a waveguide that guides the laser beam from the incident end to the emission end. Here, in the left and right direction of the active layer 110 shown in FIG. 4A, insulating layers (not shown) are further provided using a variety of materials for example, and a cross-sectional shape of the active layer 110 is adjusted on an x-y plane by the p-type cladding layer 120 and the n-type cladding layer 130 over and below the active layer 110 and the insulating layers in the left and right direction. In this manner, a waveguide is formed by the active layer 110, the p-type cladding layer 120, the n-type cladding layer 130, and the peripheral insulating layers, and the p-type cladding layer 120, the n-type cladding layer 130, and the peripheral insulating layers are to be called optical guide layers. Note that in the following description, unless otherwise specified, the waveguide in the SOA means the active layer. Further, in the following description, unless otherwise specified, a cross section of the waveguide in the SOA 10 means a cross section of the active layer 110 on the x-y plane.

Referring to FIG. 4B, a shape of the waveguide 160 of the SOA 10 will be described. FIG. 4B is a schematic drawing showing a state of the SOA 10 according to this embodiment when seen from the positive direction of the y-axis. However, in FIG. 4B, in order to describe the shape of the waveguide 160, only the n-type cladding layer 130 and the active layer 110 (i.e., the waveguide 160) are shown out of structural members of the SOA 10. Further, in FIG. 4B, the active layer 110 (the waveguide 160) is shown by hatching. Note that in the example shown in FIG. 4B, the active layer 110 (the waveguide 160) is stacked with a constant thickness with respect to the y-axis direction. Therefore, in the following description, unless otherwise specified, the shape of the waveguide 160 means the shape of the waveguide 160 on the x-z plane.

Referring to FIG. 4B, the SOA 10 according to this embodiment includes the diffusing unit 170 and the amplifying unit 180. Here, as described above, the diffusing unit 170 and the amplifying unit 180 correspond to a region where the current density is controlled by the current $I_D$ supplied to the diffusing unit upper electrode 141 and a region where the current density is controlled by the current $I_A$ supplied to the amplifying unit upper electrode 142, respectively, in the SOA 10. Therefore, the waveguide 160 is also divided into a diffusing unit waveguide 171 included in the diffusing unit 170 and an amplifying unit waveguide 181 included in the amplifying unit 180. Note that although FIG. 4B schematically shows the waveguide 160 divided between the diffusing unit 170 and the amplifying unit 180, the waveguide 160 may actually be formed continuously in the z-axis direction in the SOA 10.

The diffusing unit 170 is driven by a diffusing unit current density $J_D$ and has a function of increasing the beam diameter of the laser beam passing through the diffusing unit waveguide 171 that guides the incident laser beam. A structure of the diffusing unit waveguide 171 included in the diffusing unit 170 will be described in detail.

The diffusing unit waveguide 171 includes, as shown in FIG. 4B, a straight portion 172 in which the width of the diffusing unit waveguide 171 is substantially constant and a tapered portion 173 having a tapered shape in which the cross-sectional area of the diffusing unit waveguide 171 is gradually increased toward the travelling direction of the laser beam. The straight portion 172 is provided at a position away from the incident end of the SOA 10 by a predetermined distance, and the tapered portion 173 is continuously provided in the latter stage of the straight portion 172. That is, as shown in FIG. 4B, the laser beam incident on the waveguide 160 of the SOA 10 passes through the straight portion 172 and the tapered portion 173 of the diffusing unit waveguide 171 in this order.

In this embodiment, the value of the diffusing unit current density $J_D$ is controlled to be in at least a range such that the width of the laser beam is not narrowed. Specifically, the value of the diffusing unit current density $J_D$ is controlled such that the intensity of the laser beam is not amplified in the diffusing unit 170 and the converging phenomenon is not generated. The value of the diffusing unit current density $J_D$ may be more preferably controlled such that the intensity of the laser beam in the diffusing unit 170 is kept substantially constant. The value of the diffusing unit current density $J_D$ with which the intensity of the laser beam is kept substantially constant in this manner is determined as appropriate in accordance with conditions such as the value of a taper angle θ of the tapered portion 173, the cross-sectional area of the diffusing unit waveguide 171, materials for the active layer 110, the p-type cladding layer 120, and the n-type cladding layer 130, and the wavelength band of the laser beam to be amplified. In this embodiment, for example, by setting the diffusing unit current density $J_D$ to be ≈3 (kA/cm$^2$), a state can be achieved where the laser beam is not absorbed nor amplified in the diffusing unit 170 and the intensity is kept substantially constant. Therefore, when the laser beam passes through the tapered portion 173 of the diffusing unit waveguide 171, the width of the laser beam is gradually increased in accordance with the width of the tapered portion 173. Such an increase in the width (a spot diameter) of the laser beam in this manner is called diffusion in this embodiment. Further, in the following description, the width of the laser beam is also referred to as the beam width, and the spot diameter of the laser beam is also referred to as a beam diameter.

Note that, in the following description, the width of the diffusing unit waveguide 171 at the incident end of the SOA 10 (i.e., the width of the straight portion 172), the width of the diffusing unit waveguide 171 at the exit of the tapered portion 173, the waveguide length of the diffusing unit waveguide 171, the waveguide length of the straight portion 172, the taper angle of the tapered portion 173, the waveguide length of the tapered portion 173, and the waveguide length of the waveguide 160 are also represented by the following symbols: $w_{in}$, $w_{out\_dif}$, $L_D$, $L_{DS}$, $\theta$, $L_{DT}$, and L, respectively. In this embodiment, as an example, $w_{in}$, $w_{out\_dif}$, $L_D$, $L_{DS}$, $L_{DT}$, $\theta$, and L are set to ≈1.5 (μm), ≈14 (μm), ≈1100 (μm), ≈600 (μm), ≈500 (μm), ≈0.72 (deg), and ≈3000 (μm), respectively.

The amplifying unit 180 is driven by an amplifying unit current density $J_A$ that is higher than the diffusing unit current density $J_D$, and has a function of amplifying the intensity of the laser beam that passes through the amplifying unit waveguide 181 that guides the laser beam whose beam diameter has been increased by the diffusing unit 170. Specifically, the amplifying unit 180 causes the amplifying unit waveguide 181 included in the amplifying unit 180 to generate the amplifying unit current density $J_A$, so that a so-called inverted distribution state is generated. In this state, the laser beam is made incident on the amplifying unit waveguide 181, so that stimulated emission occurs in the amplifying unit waveguide 181 and the intensity of the incident laser beam is amplified. As described above, since the diffusing unit current density $J_D$ is set in a range such that the converging phenomenon is not generated in the diffusing unit 170, that is, a range such that the intensity of the laser beam is not amplified, the current density higher than the diffusing unit current density $J_D$ is expected for the amplifying unit 180 that amplifies the intensity of the laser beam; that is why the amplifying unit current density $J_A$ is set to be higher than the diffusing unit current density $J_D$.

As shown in FIG. 4B, the amplifying unit waveguide 181 is provided at the latter stage of the tapered portion 173 of the diffusing unit waveguide 171. In the example shown in FIG. 4B, the amplifying unit waveguide 181 has a tapered shape in which the width of the amplifying unit waveguide 181 is gradually increased toward the traveling direction of the laser beam in accordance with the tapered shape of the tapered portion 173. Note that the shape of the amplifying unit waveguide 181 is not limited to this example and may be any other shape. Since the amplifying unit 180 in this embodiment has a function of amplifying the intensity of the laser beam, the width of the laser beam may be narrowed in the amplifying unit 180. Therefore, the amplifying unit waveguide 181 may have any shape as long as the shape does not prevent the diffusing unit 170 from diffusing the laser beam. In this manner, the amplifying unit waveguide 181 may be set such that the cross-sectional area of the amplifying unit waveguide 181 is larger than the cross-sectional area of the diffusing unit waveguide 171. For example, the amplifying unit waveguide 181 may have a shape in which the width of the amplifying unit waveguide 181 is larger than the width $w_{out\_dif}$ of the diffusing unit waveguide 171 at an exiting portion of the diffusing unit 170.

In the following description, the width of the amplifying unit waveguide 181 at the emission end of the SOA 10 and the length of the amplifying unit waveguide 181 are represented by the following symbols: $w_{out}$ and $L_A$, respectively. In this embodiment, for example, $w_{out}$ and $L_A$ are set to ≈61 (μm) and ≈1900 (μm), respectively.

The structure of the SOA 10 according to this embodiment has been described above with reference to FIGS. 4A and 4B. With the SOA 10 according to this embodiment, it is possible to suppress narrowing of the width of the laser beam because, after the diffusing unit 170 diffuses the laser beam, the amplifying unit 180 amplifies the intensity of the laser beam.

Figure 5:
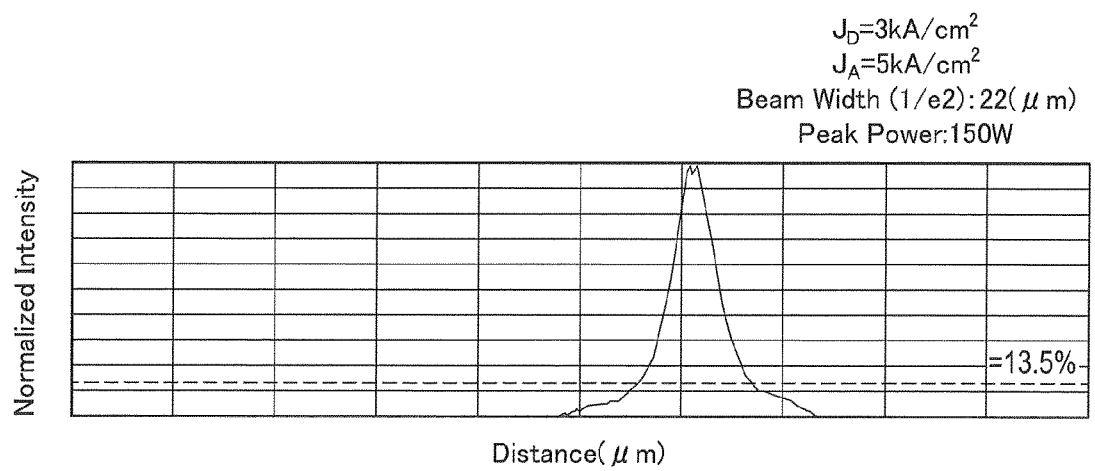
FIG. 5 is a graph showing intensity distribution of emitted light from an SOA 10.

In order to confirm the performance of the SOA 10 having the above-described structure, intensity distribution of the emitted light from the SOA 10 is measured. FIG. 5 shows the results of the measurement on the SOA 10. FIG. 5 is a graph showing the intensity distribution of emitted light from the SOA 10.

In FIG. 5, the horizontal axis represents a distance in the x-axis (Distance (μm)), the vertical axis represents normalized intensity of emitted light from the SOA 10, and the intensity distribution of emitted light from the SOA 10 in the x-axis direction is plotted. Note that in FIG. 5, in order to show the beam width, a broken line is shown at a height where the intensity of emitted light becomes 13.5% of the peak power. Note that, as in FIGS. 3A and 3B above, the value of the beam width at the emission end is a value obtained by, based on the intensity distribution of emitted light in the x-axis direction, converting the width of emitted light at a point where the intensity of the emitted light becomes 1/e2 (13.5%) of the peak power into the beam width at the emission end by using the measurement results in ASE. Further, the results shown in FIG. 5 are results when a laser beam having a wavelength of about 405 nm, a diffusing unit current density $J_D$ of 3 (kA/cm$^2$), an amplifying unit current density $J_A$ of 5 (kA/cm$^2$), and an average intensity of 4 (mW) is made incident on the SOA 10 having the above-described sizes of the structural members.

Referring to FIG. 5, in the SOA 10 according to this embodiment, when the peak power of the emitted light is about 150 (W), the beam width at the emission end is about 22 (μm). Further, the average power of the emitted light is about 300 (mW). Here, in the existing SOA 910 shown in FIG. 3B, when the current density J is 6.7 (kA/cm$^2$), the peak power of emitted light is 145 (W) and the beam width at the emission end is 7.6 (μm). Therefore, it is found that the SOA 10 according to this embodiment amplifies the intensity of the laser beam to substantially the same peak power as the existing SOA 910 by the lower current density ($J_A$=5 (kA/cm$^2$)). Further, while the beam width at the emission end in the existing SOA 910 is narrowed to the value that is smaller than the width (about 9 (μm)) of the waveguide 916 at the incident end, the beam width in the SOA 10 according to this embodiment is kept larger than the width ($w_{in}$≈1.5 (μm)) of the waveguide 160 at the incident end and the width ($w_{out\_dif}$≈14 (μm)) of the diffusing unit waveguide 171 at the exit of the diffusing unit 170.

As described above, with the SOA 10 according to this embodiment, it becomes possible to suppress narrowing of the width of the laser beam by making the diffusion unit 170 diffuse the laser beam and then by making the amplifying unit 180 amplify the intensity of the laser beam. For example, as described above, the SOA 10 suppresses narrowing of the beam width even when the peak power of the laser beam is amplified to substantially the same level as the existing SOA 910. In this manner, the SOA 10 according to this embodiment makes it possible to amplify the intensity of the laser beam more stably.

<3. Discussion on Soa According to Embodiment>

Here, results of theoretical discussions on behavior of light in the SOA 10 according to this embodiment will be described. Specifically, factors influencing narrowing of the beam width in the SOA 10 are analyzed and factors suppressing narrowing of the beam width are discussed.

Prior to analysis on the SOA 10 described in the above <2. Embodiment of present disclosure>, the present inventor has studied an SOA for testing that has a simpler structure than the SOA 10. In the following description, first, <3-1. SOA for testing> will show a structure of the SOA for testing and measured results of intensity distribution of emitted light from the SOA for testing. Next, <3-2. Optical propagation simulation> will show an overview of simulation techniques introduced so as to analyze a physical phenomenon generated in waveguides of the SOA for testing and the SOA 10. Lastly, <3-3. Results of optical propagation simulation> will show results of simulation on the SOA for testing and the SOA 10, based on the simulation results, discuss the behavior of light in the SOA for testing and the SOA 10, and study factors influencing narrowing of the beam width.

<3-1. SOA for Testing>

As described in the above <1. Study on existing SOA>, narrowing of the beam width in the SOA is considered to be generated by a change in the refractive index n of a medium in the active layer (the waveguide) depending on the intensity of the laser beam and by converging (focusing) of the laser beam (converging phenomenon (focusing phenomenon)). As factors influencing the refractive index n of the medium, a carrier density (an electron-hole density) N in the medium, a light density S in the medium, a temperature T in the medium, a wavelength λ of the laser beam can be considered. Here, changes in the refractive index n originating from the carrier density N and the light density S are known as a carrier-induced refractive index change and nonlinear optical effects including optical Kerr effects.

In order to find a dominant factor of the change in the refractive index n of the medium among the above-described factors, the present inventor has studied the SOA according to this embodiment. Among the above-described factors, the temperature T and the wavelength λ are difficult to change significantly because of conditions for usage of the SOA and a laser light source system including the SOA. Therefore, the present inventor has studied influence of the carrier density N and the light density S on the converging phenomenon. It is important to study these parameters in detail also because the amplifying performance of the SOA, i.e., the intensity of emitted light generated by stimulated emission depends on the carrier density N and the light density S. In order to study the influence of the carrier density N and the light density S on the converging phenomenon, first, the present inventor has examined the SOA for testing having a simpler structure than the SOA 10.

Figure 6:
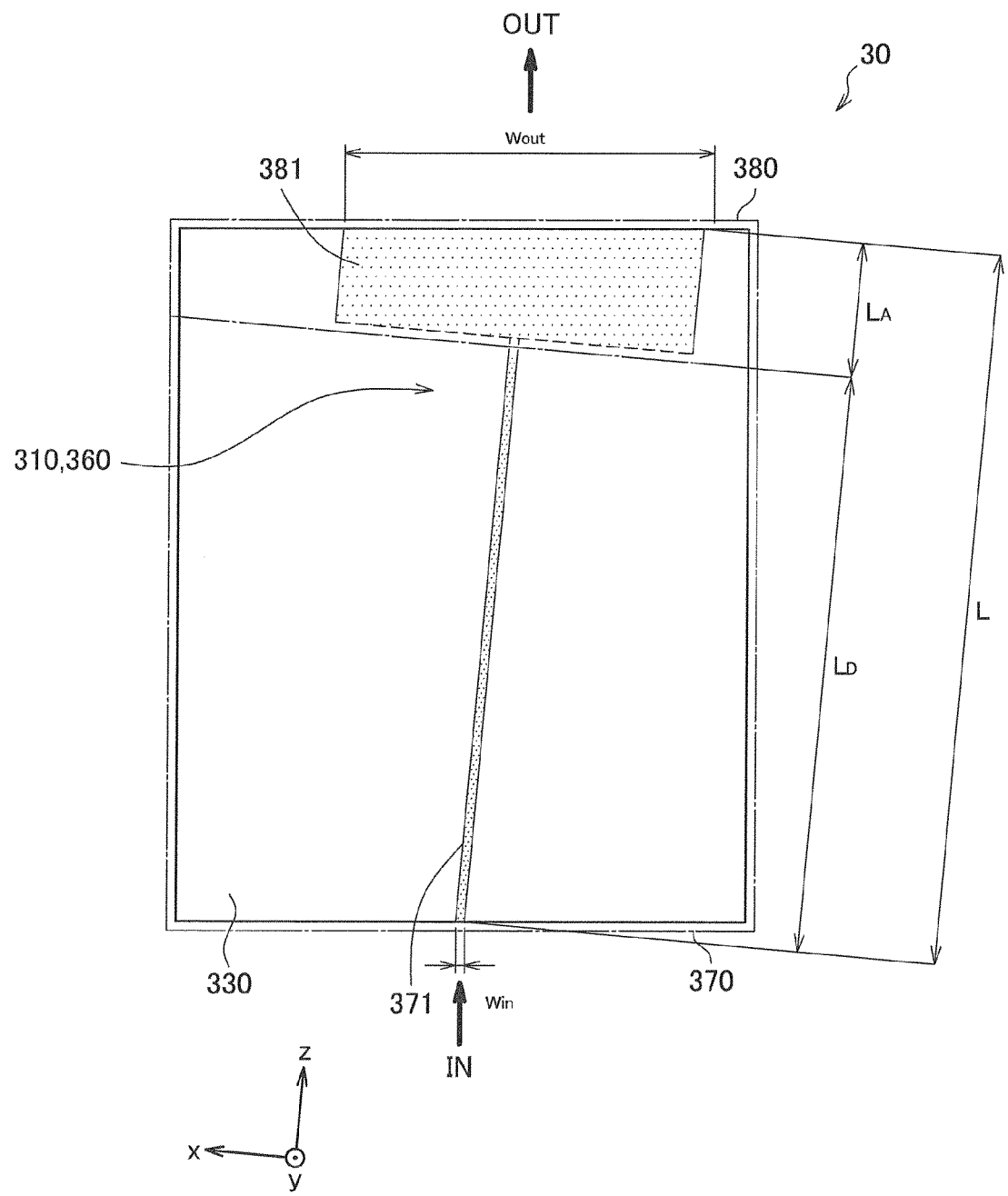
FIG. 6 is a schematic drawing showing a structure of an SOA for testing.

A structure of the SOA for testing will be described with reference to FIG. 6. FIG. 6 is a schematic drawing showing the structure of the SOA for testing. Note that a stack structure of the SOA for testing shown in FIG. 6 is the same as the stack structure of the SOA 10 described with reference to FIG. 4A; therefore, a description of the stack structure of the SOA for testing will be omitted. In addition, FIG. 6 is a view corresponding to the above-described FIG. 4B and schematically shows the structure of the SOA for testing when seen from a top direction in the direction in which semiconductor layers are stacked. A waveguide is shown by hatching.

Referring to FIG. 6, among structural members of an SOA 30 for testing according to this embodiment, only an n-type cladding layer 330 and an active layer 310 (a waveguide 360) are shown. Note that, as described above, since the SOA 30 for testing has the same stack structure as the SOA 10 shown in FIG. 4A, the SOA 30 for testing has other structures that are not shown in FIG. 6, such as a p-type cladding layer, a lower electrode, and an upper electrode (including a diffusing unit electrode and an amplifying unit electrode). As shown in FIG. 6, the SOA 30 for testing according to this embodiment includes a diffusing unit 370 and an amplifying unit 380. Further, a waveguide 360 is divided into a diffusing unit waveguide 371 included in the diffusing unit 370 and an amplifying unit waveguide 381 included in the amplifying unit 380. Here, functions and the structure of the SOA 30 for testing are the same as those of the SOA 10 except for the shape of the waveguide 360 (including the diffusing unit waveguide 371 and the amplifying unit waveguide 381); therefore, a detailed description of the same structures will be omitted and differences will be mainly described below.

The diffusing unit waveguide 371 is extended in the z-axis direction and has a substantially constant waveguide width, as shown in FIG. 6. In this manner, the diffusing unit waveguide 371 has a straight shape, i.e., a substantially rectangular shape having a predetermined width when seen from the y-axis direction. A waveguide width $w_{in}$ of the diffusing unit waveguide 371 is, for example, ≈1.5 (μm), and a length $L_D$ of the diffusing unit waveguide 371 is, for example, 1600 (μm).

The amplifying unit waveguide 381 is provided at the latter stage of the diffusing unit waveguide 371. As shown in FIG. 6, the amplifying unit waveguide 381 is extended in the z-axis direction and has a substantially constant waveguide width that is larger than the waveguide width of the diffusing unit waveguide 371. That is, the amplifying unit waveguide 381 has a straight shape. In this manner, the diffusing unit waveguide 371 and the amplifying unit waveguide 381 has a shape in which two substantially rectangular shapes each having a predetermined width when seen from the y-axis direction are combined. A waveguide width $w_{out}$ of the amplifying unit waveguide 381 is, for example, ≈60 (μm), and a length $L_A$ of the amplifying unit waveguide 381 is, for example, ≈400 (μm). A length L of the waveguide 360 is ≈2000 (μm). Note that although FIG. 6 schematically shows the waveguide 360 divided between the diffusing unit 370 and the amplifying unit 380, the waveguide 360 may actually be formed continuously in the z-axis direction in the SOA 30 for testing.

Figure 7A:
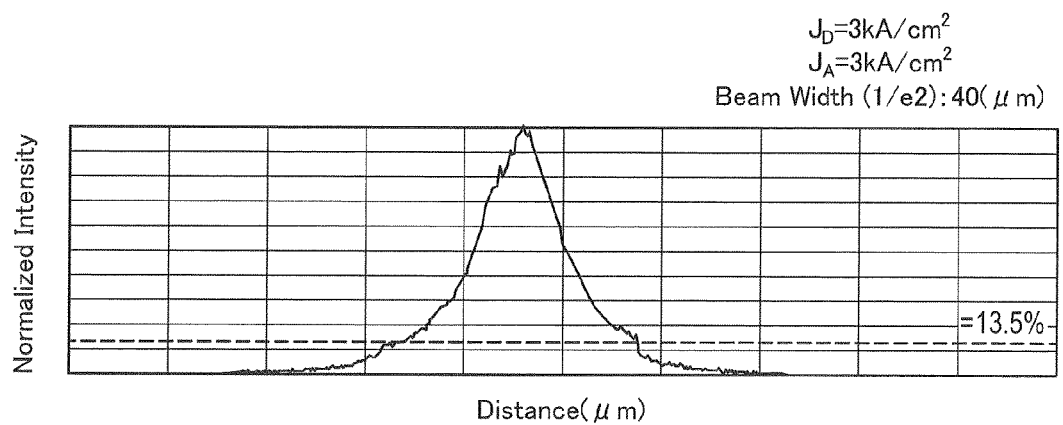
FIG. 7A is a graph showing intensity distribution of emitted light from an SOA for testing.
Figure 7B:
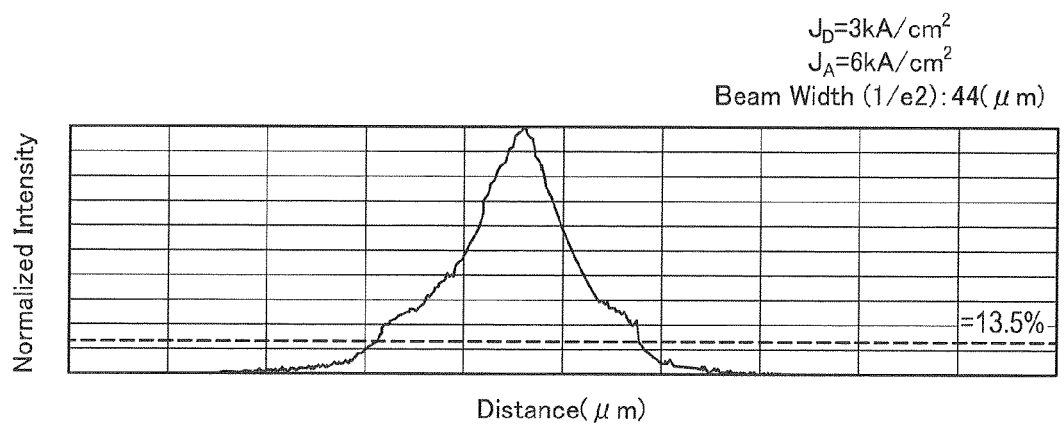
FIG. 7B is a graph showing intensity distribution of emitted light from an SOA for testing.

The structure of the SOA 30 for testing, in particular, the shape of the waveguide 360, has been described above with reference to FIG. 6. The present inventor has measured intensity distribution of emitted light from the SOA 30 for testing having such a structure. FIGS. 7A and 7B show the results.

The intensity distribution of emitted light from the SOA 30 for testing will be described with reference to FIGS. 7A and 7B. FIGS. 7A and 7B are each a graph showing the intensity distribution of emitted light from the SOA 30 for testing.

Here, the graphs shown in FIGS. 7A and 7B each have the same form (e.g., physical amounts represented by the x-axis and the y-axis) as the graph showing the intensity distribution of emitted light from the SOA 10 shown in FIG. 5; therefore, a detailed description thereof will be omitted. Further, in FIGS. 7A and 7B, as well as in FIG. 5, the value of the beam width at the emission end is a value obtained by, based on the intensity distribution of emitted light in the x-axis direction, converting the width of emitted light at a point where the intensity of the emitted light becomes 1/e2 (13.5%) of the peak power into the beam width at the emission end by using the measurement results in ASE. Further, the results shown in FIGS. 7A and 7B are results when a laser beam having a wavelength of about 405 nm, a diffusing unit current density $J_D$ of 3 (kA/cm$^2$), and an average intensity of 4 (mW) is made incident on the SOA 30 for testing having the above-described sizes of structural members. Note that FIG. 7A shows the results when the amplifying unit current density $J_A$ is 3 (kA/cm$^2$) and FIG. 7B shows the results when the amplifying unit current density $J_A$ is 6 (kA/cm$^2$).

Referring to FIGS. 7A and 7B, in the SOA 30 for testing, when the amplifying unit current density $J_A$ is 3 (kA/cm$^2$), the beam width at the emission end is about 40 (μm), and when the amplifying unit current density $J_A$ is 6 (kA/cm$^2$), the beam width at the emission end is about 44 (μm). Although the value of the amplifying unit current density $J_A$ is doubled, the beam width is not substantially changed. Therefore, the amplifying unit 380 of the SOA 30 for testing is considered to generate no substantial narrowing of the beam width, i.e., no substantial converging phenomenon.

A change in the amplifying unit current density $J_A$ corresponds to a change in the carrier density N in the amplifying unit waveguide 381. That is, the results shown in FIGS. 7A and 7B indicate that there is no significant influence of the carrier density N on the converging phenomenon. Meanwhile, in the SOA 30 for testing, the diffusing unit waveguide 371 and the amplifying unit waveguide 381 each has an extended straight shape in which the waveguide width is substantially constant, and the width of the waveguide 360 is greatly increased from about 1.5 (µm) to about 60 (µm) when light propagates from the diffusing unit 370 to the amplifying unit 380. Therefore, the amplifying unit waveguide 381 have a small value of the light density S, and accordingly, it is considered that the change in the refractive index n is small and the converging phenomenon is unlikely to occur.

Further, in the SOA 30 for testing, the width $w_{out}$ of the waveguide 360 at the emission end is ≈60 (µm). Although there is no substantial converging phenomenon, the beam width at the emission end is about 40 µm. The results reveal that, even when the converging phenomenon does not occur substantially, the beam width is not increased infinitely in accordance with the width of the waveguide 360 but there may be a limitation on the diffusion of the beam width. Such a limit value of the diffusion of the beam width is considered to be attributed to a diffraction limit in accordance with the wavelength of the laser beam caused by diffraction of the laser beam.

In this manner, the results in FIGS. 7A and 7B indicate that, in the SOA 30 for testing according to this embodiment, the change in the refractive index n in the medium in the waveguide is more significantly influenced by the light density S than by the carrier density N. The same phenomenon as the indicated phenomenon is considered to occur also in SOA 10. In order to confirm the above discussions and to further analyze the behavior of light in the waveguides 160 and 360 of the SOA 10 and the SOA 30 for testing, the present inventor has developed a technique for optical propagation simulation involving the change in the refractive index n due to the light density S. Here, the "change in the refractive index n due to the light density S" refers to the carrier-induced refractive index change.

<3-2. Optical Propagation Simulation>

An overview of the simulation technique according to this embodiment will be described. In order to analyze a state of optical propagation in the waveguide, the present inventor has created a simulation technique using a finite difference-beam propagation method (FT-BPM), involving the effects of the change in the refractive index n accompanied by the change in the carrier density due to the light density S (the carrier-induced refractive index change). For details of the FT-BPM, for example, refer to "Chapter 5: Beam Propagation Method" in Kawano Kenji and Kitou Tsutomu, "Hikari Douharo Kaiseki No Kiso: Maxwell Equation and Schrodinger Equation Wo Toku Tameni", Gendai Kogakusha, July 1999 (hereinafter referred to as Reference 1). For details of an analysis technique involving the carrier-induced refractive index change in a wave function, for example, refer to GOVIND P. AGRAWAL et al., "Self-Phase Modulation and Spectral Broadening of Optical Pulses in Semiconductor Laser Amplifiers", IEEE JOURNAL OF QUANTUM ELECTRONICS, 1989, Vol. 25, No. 11, pp. 2297-2306 (hereinafter referred to as Reference 2). Based on References 1 and 2, the present inventor has developed the simulation technique using FT-BPM involving the carrier-induced refractive index change. An overview of the newly developed simulation technique according to this embodiment will be described below. Note that in the following description of the simulation technique, a simulation technique to analyze the behavior of light in the two dimension (on the x-z plane) will be described on the assumption that the waveguides 160 and 360 (including the active layers 110 and 310) has a constant thickness in the y-axis direction and no change is generated in the intensity of the laser beam in the y-axis direction.

In a case where the carrier-induced refractive index change is involved, the wave function in the medium (the active layers 110 and 310 in this embodiment) is expressed by the following formula (1).

$$-\frac{\partial^2 \psi}{\partial x^2} - \frac{\partial^2 \psi}{\partial z^2} = -\frac{\varepsilon_r + \chi_{car\_ind}(N)}{c^2} \frac{\partial^2 \psi}{\partial t^2} \quad (1)$$

Here, $\psi=\psi(x,z,t)$ is the wave function representing the behavior of the laser beam in the medium, and is, for example, a wave function representing the electric field of the laser beam. As described above, expansion in the y-axis direction is neglected by $\psi$. Further, c, $\varepsilon_r$, $\chi_{car\_ind}(N)$ represent the light speed, the dielectric constant (the complex dielectric constant) of the medium, the susceptibility of the medium, which is a function of the carrier (electrons or holes) density N in the medium, respectively.

In order to solve the formula (1) for the wave function $\psi(x,z,t)$, slow varying envelop approximation (SVEA) is performed. In SVEA, the wave function $\psi(x,z,t)$ is represented by an amplitude term $\phi(x,z,t)$ that changes gradually in the travelling direction and a phase term $\exp[((-j(\beta_0 z-\omega_0 t)]$ that intensively vibrates. That is, the wave function $\psi(x,z,t)$ is approximated as in the following formula (2).

$$\psi(x,z,t)=\phi(x,z,t)\exp[-j(\beta_0 z-\omega_0 t)] \quad (2)$$

Here, $\beta_0$ is defined by the product of a reference refractive index $n_{eff}$ and a wave vector $k_0$ in vacuum. As the reference refractive index $n_{eff}$, for example, the refractive index of any of the cladding layers (the p-type cladding layer 120 and the n-type cladding layers 130 and 330), a substrate, or the like is used. Further, $\omega_0$ is the center frequency.

By assigning the formula (2) in the formula (1) to be expanded, the following formula (3) is obtained. Note that in a process in which the formula (3) is obtained, paraxial ray approximation (Fresnel approximation) is used so that $(\delta^2\phi)/(\delta z^2)=0$ is set. In a similar manner, since the change in the envelope $\phi$ over time is sufficiently slower than that in the central frequency $\omega_0$, $(\delta^2\phi)/(\delta t^2)=0$ is set.

$$(2j\beta_0)\frac{\partial \phi(x,z,t)}{\partial z} = \frac{\partial^2 \phi(x,z,t)}{\partial x^2} - k_0^2(n_{eff}^2 - \varepsilon_r)\phi(x,z,t) + k_0\chi_{car\_ind}(N)\phi(x,z,t) - \frac{\varepsilon_r + \chi_{car\_ind}(N)}{c^2}(2j\omega_0)\frac{\partial \phi(x,z,t)}{\partial t} \quad (3)$$

In the formula (3), the left side and the first and second terms of the right side are a common wave equation in FT-BPM (as shown in Reference 1, for example). That is, the formula (3) corresponds to an equation in which terms about the susceptibility $\chi_{car\_ind}(N)$ (the rest two terms of the right side) are added to the common wave equation in FT-BPM as terms related to the carrier-induced refractive index change.

For a method to solve the common wave equation in FT-BPM, refer to Reference 1, for example. When the susceptibility $\chi_{car\_ind}(N)$ can be calculated numerically, the formula (3) can be solved numerically. Here, $\chi_{car\_ind}(N)$ is expressed by the following formula (4).

$$\chi_{car\_ind}(N) = \frac{n_{eff}(i+\alpha)\Gamma\eta(N-N_0)}{k_0} \quad (4)$$

Here, α is a coefficient also called line-width enhancement factor, and influences diffusion and narrowing of the beam width. Further, $N_0$ is a transparent carrier density. In addition, η and Γ are a grain coefficient and a confinement factor, respectively, and are in relationship with a grain g (N) as in the following formula (5).

$$g(N)=\Gamma\eta(N-N_0) \quad (5)$$

Further, the carrier density N satisfies the following formula (6).

$$\frac{dN}{dt} = \frac{I}{eV_{act}} - \frac{N}{\tau_g} - \frac{\Gamma\eta(N-N_0)}{\frac{h}{2\pi}\omega_0}|\phi(x,z,t)|^2 \quad (6)$$

Here, e, I, $V_{act}$, $\tau_g$, and $h/(2\pi)\times\omega_0$ represent charge of carriers (elementary electric charge), injected current, active volume, spontaneous carrier lifetime, and energy of photons, respectively.

By removing the carrier density N from the formulas (5) and (6), the following formula (7) related to the grain g is obtained.

$$\frac{dg}{dt} = -\frac{g-g_0}{\tau_g} - \frac{g|\phi(x,z,t)|^2}{E_{sat}} \quad (7)$$

Here, $g_0$ and $E_{sat}$ are defined by the following formula (8) and the following formula (9), respectively. Note that $g_0$ and $E_{sat}$ represent a small signal gain and saturation energy in a target amplifier, respectively. Further, $E_{sat}$ is normalized by a mesh size at the time of simulation.

$$g_0 = \eta\left(\frac{\tau_g I}{eV_{act}} - N_0\right) \quad (8)$$

$$E_{sat} = \frac{\frac{h}{2\pi}\omega_0}{\Gamma\eta} \quad (9)$$

Here, on the assumption that a continuous wave laser (CW laser) is used, since (d/dt)=0, by solving the gain g in the above formula (7), the following formula (10) is obtained.

$$g = \frac{g_0}{1 + \frac{\tau_g|\phi(x,z,t)|^2}{E_{sat}}} \quad (10)$$

By calculating the formula (10) every time the values of (x,z,t) are changed, the value of the grain g at the corresponding coordinate (position (x,z)) and the corresponding step (time t) can be obtained. By using the value of the grain g and the above formulas (4) and (5), the susceptibility $\chi_{car\_ind}(N)$ at the corresponding coordinate and the corresponding step can be obtained; accordingly, the formula (3) can be solved numerically.

The overview of the simulation technique for analyzing the SOA 10 and the SOA 30 for testing according to this embodiment has been described above.

<3-3. Results of Optical Propagation Simulation>

By using the above simulation technique, the state of propagation of the laser beam in the waveguides 160 and 360 of the SOA 10 shown in FIGS. 4A and 4B and the SOA 30 for testing shown in FIG. 6 is analyzed.

First, results of simulation of the SOA 30 for testing having a simpler structure will be described with reference to FIGS. 8A to 8C and FIG. 9. Note that in the simulation of the SOA 30 for testing, the calculation has been performed without involving the influence of the light density S, i.e., the carrier-induced refractive index change. Specifically, simulation without involving the carrier-induced refractive index change corresponds to simulation based on a relational expression in which the terms related to the susceptibility $\chi_{car\_ind}(N)$ are neglected in the above formula (3). As described in the above <3-1. SOA for testing>, the results shown in FIGS. 7A and 7B indicate that the light density S has a significant influence on the converging phenomenon and the converging phenomenon does not occur substantially in the SOA 30 for testing because the light density S is low in the amplifying unit 380. Accordingly, when the results shown in FIGS. 7A and 7B are reproduced by the simulation without involving the effects of the light density S, it can be said that the above discussion is valid.

Figure 8A:
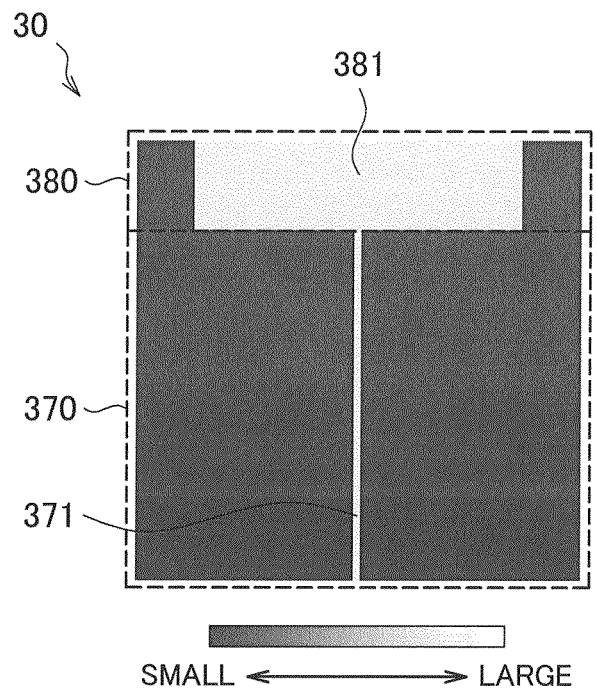
FIG. 8A is a contour drawing showing values of an SOA for testing in a real part of a complex dielectric constant at respective coordinates obtained through simulation.
Figure 8B:
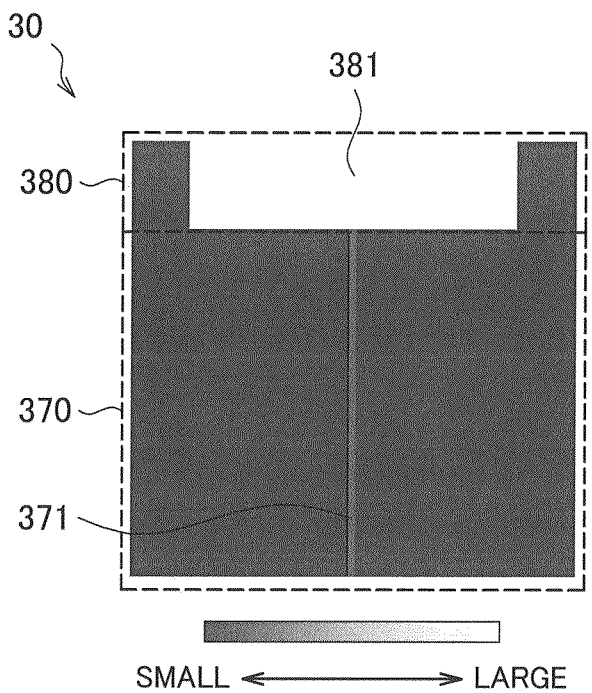
FIG. 8B is a contour drawing showing values of an SOA for testing in an imaginary part of a complex dielectric constant at respective coordinates obtained through simulation.
Figure 8C:
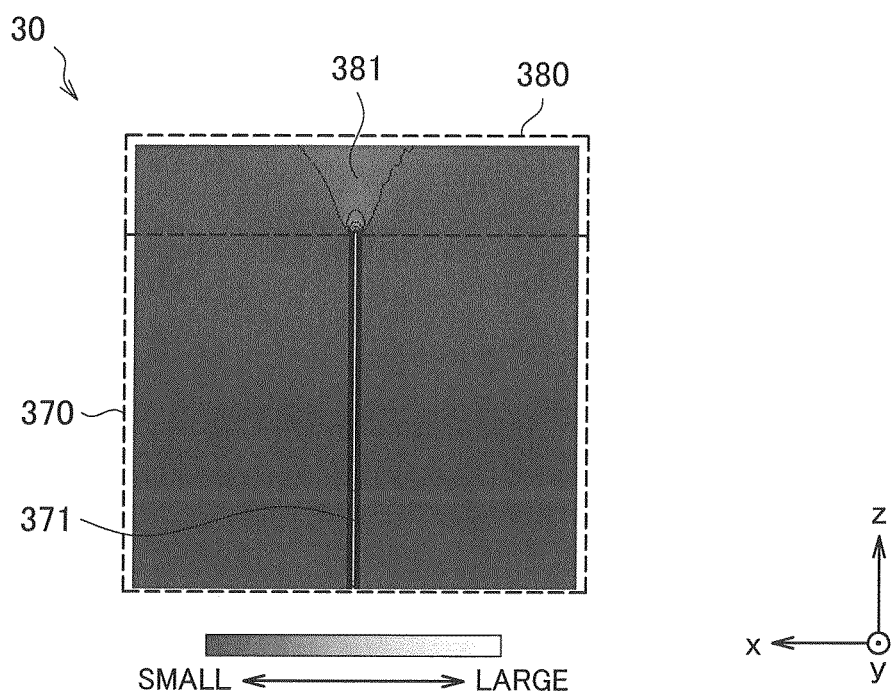
FIG. 8C is a contour drawing showing values of light intensity of an SOA for testing at respective coordinates obtained through simulation.
Figure 9:
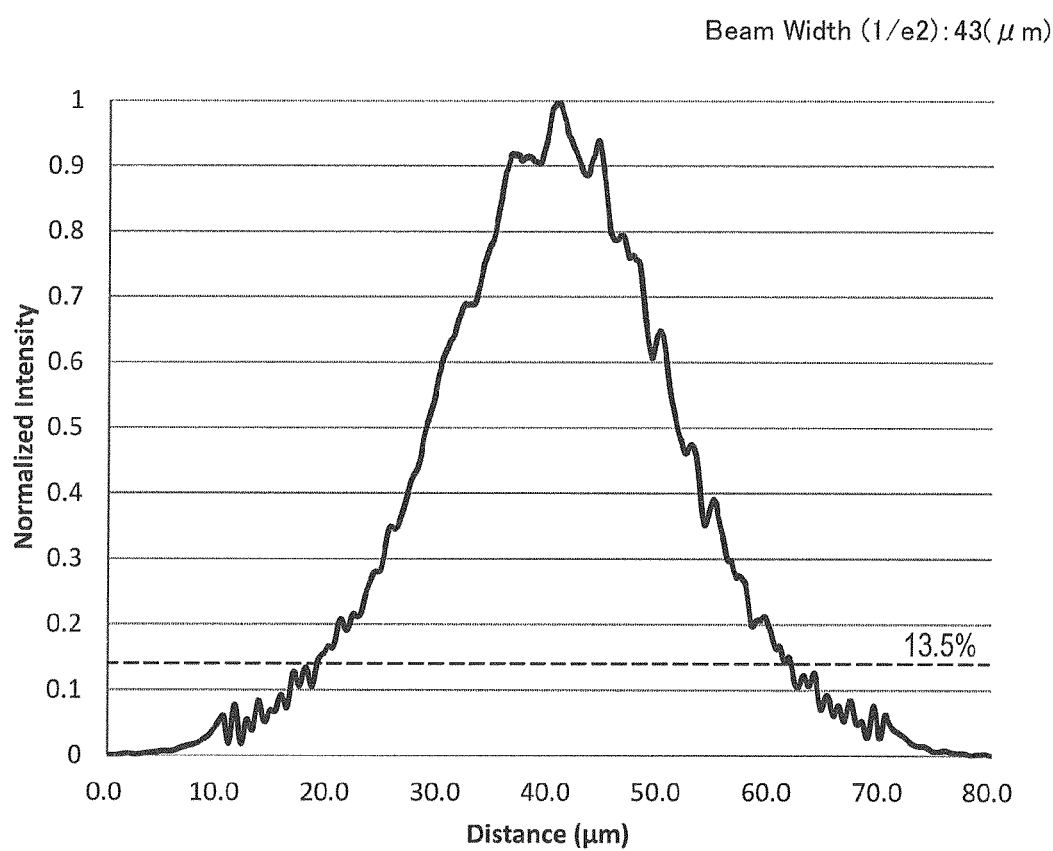
FIG. 9 is a graph showing intensity distribution of a laser beam in an x-axis direction in a position corresponding to an emission end shown in FIG. 8C.

FIGS. 8A to 8C are each a contour drawing in which each physical amount of the SOA 30 for testing, obtained through the simulation, is plotted on the x-z plane. The contour drawing in FIG. 8A shows values of the SOA 30 for testing in a real part of the complex dielectric constant at the respective coordinates obtained through the simulation. The contour drawing in FIG. 8B shows values of the SOA 30 for testing in an imaginary part of the complex dielectric constant at the respective coordinates obtained through the simulation. The contour drawing in FIG. 8C shows values of light intensity of the SOA 30 for testing at the respective coordinates obtained through the simulation. FIG. 9 is a graph showing intensity distribution of the laser beam in the x-axis direction in a position corresponding to the emission end shown in FIG. 8C. Note that the results shown in FIGS. 8A to 8C and FIG. 9 are results obtained by performing simulation under conditions corresponding to FIG. 7B.

Referring to FIGS. 8A and 8B, in the amplifying unit 380 of the SOA 30 for testing, the values in both the real part and the imaginary part of the complex dielectric constant are substantially constant independently of positions. In the optics, it is said that the real part of the complex dielectric constant is an index of the refractive index in the medium and the imaginary part of the complex dielectric constant is an amplifying rate (an absorbing rate) of light in the medium. Therefore, in FIGS. 8A and 8B, it can be said that distribution of the refractive index and the amplifying rate of light in the amplifying unit waveguide 381 of the SOA 30 for testing on the x-z plane is visualized. From FIGS. 8A and 8B, it is found that, in the amplifying unit 380 of the SOA 30 for testing, there are no substantial changes in the refractive index and the amplifying rate. The results indicate that the converging phenomenon does not occur substantially in the amplifying unit 380 of the SOA for testing.

In FIG. 8C, as described above, since the distribution of light intensity is plotted two-dimensionally (on the x-z plane), it can be said that the light density S in the amplifying unit waveguide 381 of the SOA 30 for testing is visualized. Further, a point where the value of light intensity is large is a point where the existence probability of light is high, so that it can be said that the optical path in the amplifying unit waveguide 381 of the SOA 30 for testing is visualized in FIG. 8C. Referring to FIG. 8C, light propagates from the diffusing unit 370 to the amplifying unit 380 and also the light is diffused in the x-axis direction, that is, the light density S is decreased.

FIG. 9 shows intensity distribution of the laser beam in the x-axis direction at a position corresponding to the emission end shown in FIG. 8C. In FIG. 9, the form of the graph is the same as that in FIGS. 7A and 7B so that the graph can correspond to the intensity distribution of the SOA 30 for testing obtained through measurement. That is, in FIG. 9, the horizontal axis represents a distance in the x-axis (Distance (μm)), the vertical axis represents normalized intensity of the laser beam, and the intensity distribution of the laser beam in the x-axis direction at the emission end of the SOA 30 for testing, obtained through simulation, is plotted. Further, based on the intensity distribution of the laser beam in the x-axis direction at the emission end, the value of the beam width at the emission end is defined as the width of emitted light at a point where the intensity of the laser beam becomes 1/e2 (13.5%) of the peak power. Note that in FIG. 9, in order to show the beam width, a broken line is shown at a height where the intensity of the laser beam becomes 13.5% of the peak power. Referring to FIG. 9, the beam width at the emission end of the SOA 30 for testing, obtained through simulation, is about 43 (μm). This value substantially corresponds to 44 (μm) shown in FIG. 7B. Further, when the waveform of intensity distribution shown as the measurement results in FIG. 7B is compared with the waveform of intensity distribution shown as the simulation results in FIG. 9, it is found that the waveform of intensity distribution is substantially reproduced by the simulation technique according to this embodiment.

The simulation results of the SOA 30 for testing have been described above with reference to FIGS. 8A to 8C and FIG. 9. As shown in FIGS. 8A to 8C, it is found that the simulation technique according to this embodiment can make it possible to visualize the refractive index of the medium, the amplifying rate of light, the intensity of light, and the light density S in the waveguide 360 of the SOA 30 for testing. Further, the results shown in FIGS. 8A to 8C and FIG. 9 indicate that the simulation technique can sufficiently reproduce the measurement results of the SOA 30 for testing shown in FIGS. 7A and 7B and may be valid as an analysis technique. Furthermore, the significant influence of the light density S on the converging phenomenon and no generation of the converging phenomenon in the SOA 30 for testing due to the low light density S in the amplifying unit 380, which have been discussed in <3-1. SOA for testing>, are each confirmed to be a substantially valid theory.

Next, simulation results of the SOA 10 shown in FIGS. 4A and 4B will be described with reference to FIGS. 10A to 10C and 11. Note that, unlike in the simulation of the SOA 30, in the simulation of the SOA 10, calculation is performed involving the carrier-induced refractive index change.

Figure 10A:
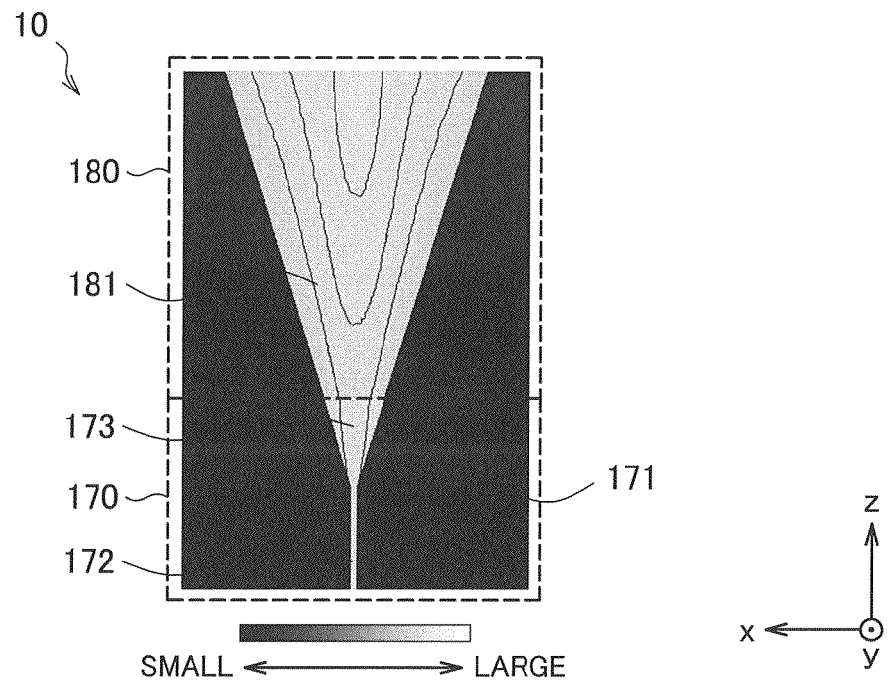
FIG. 10A is a contour drawing showing values of an SOA according to an embodiment in a real part of a complex dielectric constant at respective coordinates obtained through simulation.
Figure 10B:
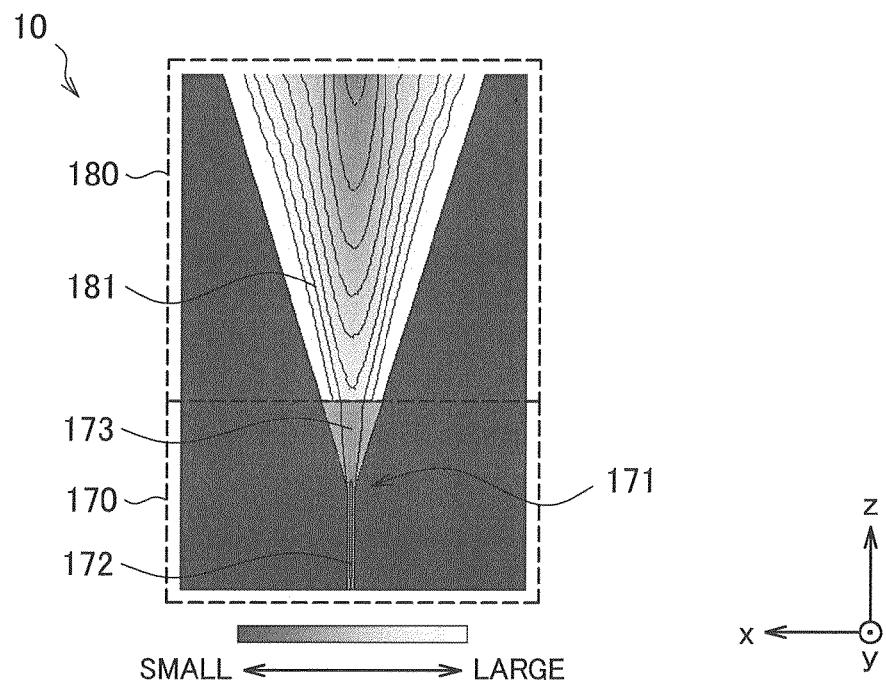
FIG. 10B is a contour drawing showing values of an SOA according to an embodiment in an imaginary part of a complex dielectric constant at respective coordinates obtained through simulation.
Figure 10C:
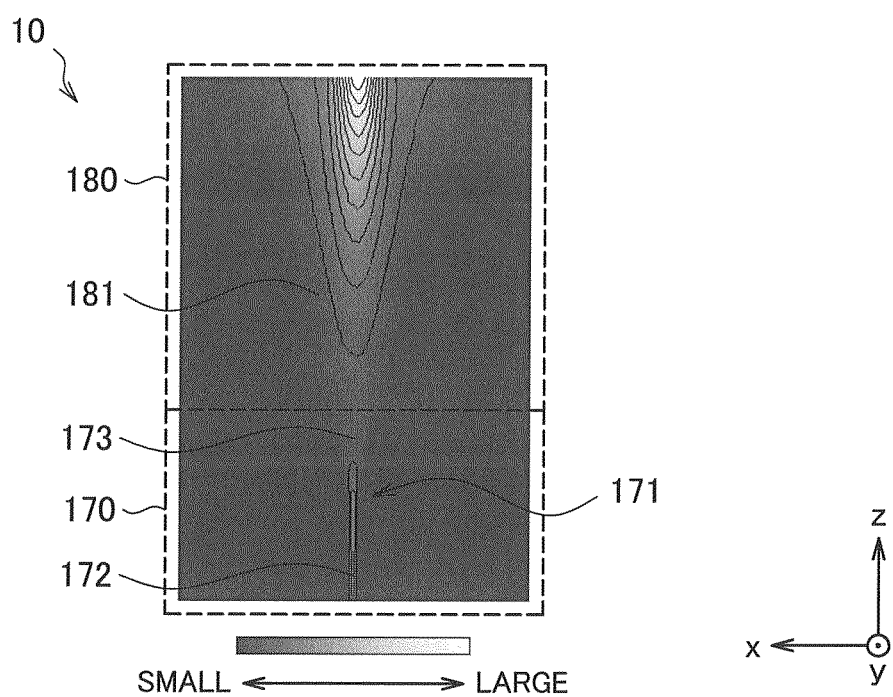
FIG. 10C is a contour drawing showing values of light intensity of an SOA according to an embodiment at respective coordinates obtained through simulation.
Figure 11:
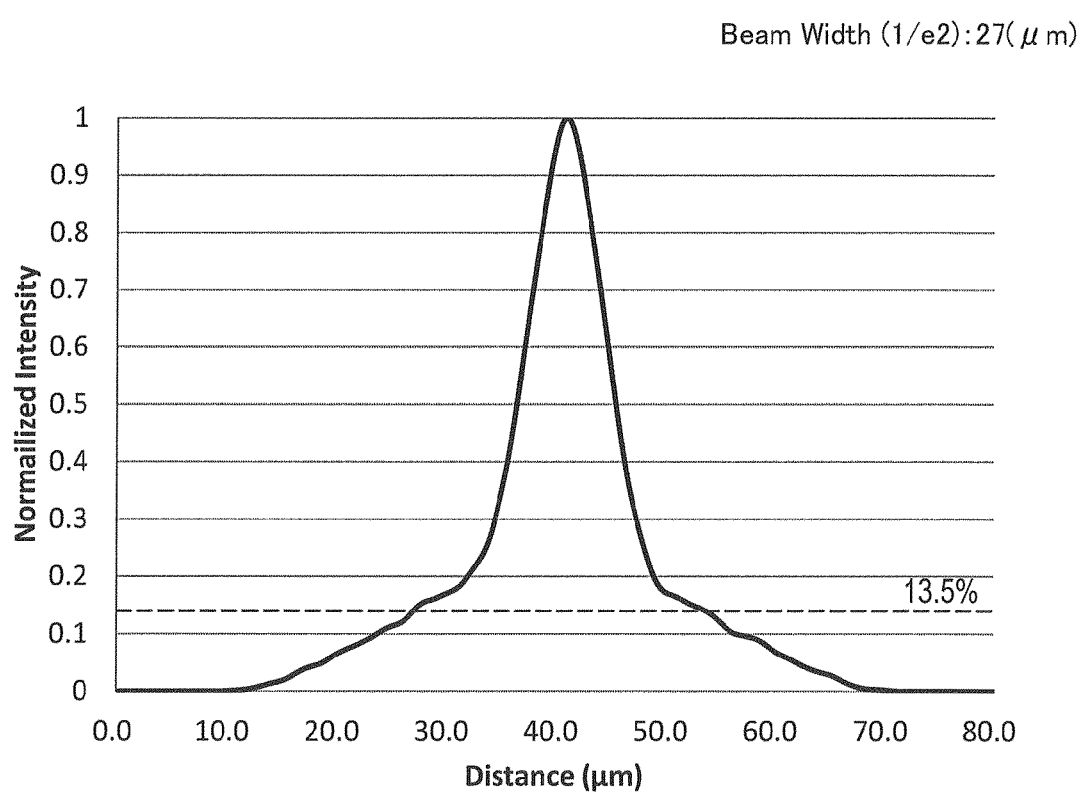
FIG. 11 is a graph showing intensity distribution of a laser beam in an x-axis direction in a position corresponding to an emission end shown in FIG. 10C.

FIGS. 10A to 10C are each a contour drawing in which each physical amount of the SOA 10, obtained through simulation, is plotted on the x-z plane, and correspond to the above FIGS. 8A to 8C. The contour drawing in FIG. 10A shows values of the SOA 10 according to this embodiment in a real part of the complex dielectric constant at the respective coordinates obtained through simulation. The contour drawing in FIG. 10B shows values of the SOA 10 according to this embodiment in an imaginary part of the complex dielectric constant at the respective coordinates obtained through simulation. The contour drawing in FIG. 10C shows values of light intensity of the SOA 10 according to this embodiment at the respective coordinates obtained through simulation. FIG. 11 is a graph showing intensity distribution of the laser beam in the x-axis direction in a position corresponding to the emission end shown in FIG. 10C. Note that the results shown in FIGS. 10A to 10C and 11 are results obtained by performing simulation under conditions corresponding to FIG. 5.

Referring to FIGS. 10A and 10B, it is found that, in the amplifying unit 180 of the SOA 10, the value in the real part of the complex dielectric constant (i.e., the index representing the refractive index of the medium of the waveguide 160) becomes larger near the center of the waveguide 160 in the x-axis and smaller near the boundary between the waveguide 160 and other peripheral layers. Meanwhile, referring to FIG. 10B, it is found that, in the amplifying unit 180 of the SOA 10, the value in the imaginary part of the complex dielectric constant (i.e., the index representing the amplifying rate of the medium of the waveguide 160) becomes smaller near the center of the waveguide 160 in the x-axis and larger near the boundary between the waveguide 160 and other peripheral layers. Further, referring to FIG. 10C, it is found that intensity distribution of light in the amplifying unit 180 of the SOA 10 becomes larger near the center of the waveguide 160 in the x-axis. The results shown in FIGS. 10A to 10C show a state in which the light density S and the light intensity are increased near the center of the amplifying unit waveguide 181 in the x-axis; accordingly, it can be said that the converging phenomenon is reproduced.

As shown in the formula (5), the gain g that is the index representing the amplifying rate is a function of the carrier density N and in proportion with the carrier density N. On the other hand, as described in the analysis of the SOA 30 for testing, the change in the refractive index can be considered to be more dependent on the light density S than on the carrier density N. Therefore, it can be said that the results shown in FIGS. 10A to 10C show a state where the converging phenomenon occurs owing to a change in the refractive index n not in a region where the amplifying rate (i.e., the carrier density) in the amplifying unit waveguide 181 is large but in a region where the light density S is large, which does not contradict the discussions on the SOA 30 for testing.

FIG. 11 shows intensity distribution of the laser beam in the x-axis direction at a position corresponding to the emission end shown in FIG. 10C. In FIG. 11, the form (physical amounts represented by the vertical axis and the horizontal axis, definition of the beam width, and the like) of the graph is the same as that in FIG. 9; therefore, a detailed description thereof will be omitted. Referring to FIG. 11, the beam width at the emission end of the SOA 10, obtained through simulation, is about 27 (μm). This value substantially corresponds to the measured value 22 (μm) shown in FIG. 5. Further, when the waveform of intensity distribution shown as the measurement results in FIG. 5 is compared with the waveform of intensity distribution shown as the simulation results in FIG. 11, it is found that the waveform of intensity distribution is also substantially reproduced by the simulation according to this embodiment.

The simulation results of the SOA 10 have been described above with reference to FIGS. 10A to 10C and FIG. 11. As shown in FIGS. 10A to 10C, with the simulation technique involving the carrier-induced refractive index change, it is confirmed that the converging phenomenon in the waveguide 160 of the SOA 10 can be reproduced. Further, in accordance with the results shown in FIGS. 8A to 8C and FIG. 9, the simulation technique according to this embodiment can sufficiently reproduce the measurement results of the SOA 10 and the SOA 30 for testing shown in FIG. 5 and FIGS. 7A and 7B and may be valid as an analysis technique.

As described above, the simulation technique for analyzing the behavior of light in the waveguides 160 and 360 in the SOA 10 and the SOA 30 for testing according to this embodiment is established. Further, comparison between the measurement results of the SOA 10 and the SOA 30 for testing and the calculation results obtained using the simulation technique leads to the following knowledge.

That is, the converging phenomenon of light in the waveguides 160 and 360 in the SOA 10 and the SOA 30 for testing is significantly influenced by the value of the light density S in the waveguides 160 and 360. Accordingly, it is considered that the converging effects can be suppressed, that is, narrowing of the beam width can be suppressed, by increasing the waveguide width of the waveguides 160 and 360 and decreasing the value of the light density S. Here, a decrease in the light density S and an increase in the beam width correspond to diffusion of the laser beam.

On the other hand, while the intensity of the laser beam is amplified by applying a relatively high current density, when the waveguide width is increased so that diffusion can occur, the laser beam may be diffused less efficiently because narrowing of the beam width due to an increase in the light density S accompanied by the amplification of the intensity of the laser beam offsets the diffusion of the laser beam due to the increase in the waveguide width. Therefore, it is desirable to diffuse the laser beam under the condition where the laser beam is not amplified, that is, the light density S is not increased, when the laser beam is to be diffused.

Referring to FIGS. 4A and 4B, the SOA 10 according to this embodiment includes the diffusing unit 170 that diffuses the laser beam and the amplifying unit 180 that amplifies the intensity of the laser beam. The diffusing unit 170 has a tapered shape in which the waveguide width is gradually increased and the value of the diffusing unit current density $J_D$ is controlled to be in a range such that the intensity of the laser beam is not amplified by the diffusing unit 170. Further, the intensity of the laser beam diffused by the diffusing unit 170 is amplified by the amplifying unit 180 provided in the latter stage. Accordingly, in the SOA 10, the laser beam can be diffused more efficiently and the converging phenomenon can be suppressed more effectively.

It is confirmed that the simulation technique according to this embodiment can be used to substantially reproduce the propagation of light in the SOA 10 and the SOA 30 for testing. Accordingly, by performing analysis using the simulation technique according to this embodiment, while changing the shape of the waveguide or various parameters such as the diffusing unit current density $J_D$ and the amplifying unit current density $J_A$, it is possible to design an SOA having another structure, the SOA being able to suppress narrowing of the beam width more effectively in a case where the intensity of the laser beam is amplified.

In the above description of the optical propagation simulation, the description has been made focusing on physical amounts on the x-z plane on the assumption that the thickness of the waveguides 160 and 360 in the y-axis direction is constant. However, this embodiment is not limited to this example and the above description can be applied to a three-dimensional case. For example, by considering the y-coordinate in the formulas shown in <3-2. Optical propagation simulation> above, a similar simulation technique can be established in a three-dimensional space. Further, for example, the waveguides 160 and 360 may have not only a two-dimensional tapered shape but also a three-dimensional tapered shape, i.e., a conic shape. When the waveguides 160 and 360 have a conic shape, the study on the beam width in the above discussion will be applied to the beam diameter so that the same conclusion can be obtained.

<4. Method for Designing SOA>

As described in <3. Discussion on SOA according to embodiment> above, by using the simulation technique according to this embodiment, it is possible to design another structure for the SOA according to this embodiment, which can suppress narrowing of the beam width. Here, another approach method to design the SOA according to this embodiment will be described. In the following description, the SOA 10 shown in FIGS. 4A and 4B is taken as an example to explain this designing method. In this case, symbols showing the dimension of the waveguide 160 shown in FIG. 4B are used. For details of derivation of the following formulas, for example, refer to Reference 2.

In the following description, on the assumption that the light density S in the waveguide 160 is too low to generate the converging phenomenon, diffusion of the laser beam in the waveguide 160 will be discussed, so that desirable conditions for the tapered shape of the waveguide 160, the amplifying unit current density $J_A$, the length $L_A$ of the amplifying unit waveguide, and the like. First, <4-1. Diffusion in waveguide made using transparent medium> will discuss the diffusion of the laser beam in a tapered waveguide formed using a transparent medium. The tapered waveguide formed using the transparent medium corresponds to the diffusing unit 170 in the SOA 10 according to this embodiment. Next, <4-2. Diffusion in waveguide formed using amplifying medium> will discuss diffusion of the laser beam in a straight waveguide formed using an amplifying medium. Lastly, based on the discussions on these two models, <4-3. Diffusion in tapered waveguide formed using amplifying medium> will discuss diffusion of the laser beam in a tapered waveguide formed using an amplifying medium. The tapered waveguide formed using the amplifying medium corresponds to the amplifying unit 180 in the SOA 10. From such discussions, diffusion of the laser beam in the diffusion unit 170 and the amplifying unit 180 and a decrease in the intensity of the laser beam accompanied by the diffusion will be discussed under the above conditions. In the following description of a designing method, a designing method expecting the behavior of light in the two dimension (on the x-z plane) will be described on the assumption that the thickness of the waveguide 160 (including the active layer 110) is constant in the y-axis direction and the intensity of the laser beam does not change in the y-axis direction.

<4-1. Diffusion in Waveguide Formed Using Transparent Medium>

First, diffusion of the laser beam in a transparent medium will be considered. The propagation of light in a tapered waveguide (e.g., a waveguide having the same shape as the waveguide 916 shown in FIG. 1B) formed using a uniform transparent medium will be considered. In a case where the x-axis and the y-axis are set as in FIG. 1B, the origin of the x-axis is set as the center of the waveguide in the x-axis direction, the origin of the z-axis is set as the incident end of the waveguide, and the width of the waveguide on the incident side is set as $w_{in\_tt}$, intensity $P_{in\_tt}(x)$ of the incident light is expressed by the following formula (11). Note that it is assumed that the laser beam has intensity distribution represented by Gaussian.

$$P_{in\_tt}(x) = A\sqrt{\frac{2}{\pi}} \frac{1}{w_{in\_tt}} \exp\left[-2\frac{x^2}{w_{in\_tt}^2}\right] \qquad (11)$$

Here, A represents a coefficient related to the intensity of the laser beam. Therefore, intensity $P_{tt}(x,z)$ of the laser beam at a position where the light propagates through the waveguide by a distance z can be, in a case where the waveguide width at the distance z is represented by $w_{tt}(z)$, expressed by the following formula (12).

$$P_{tt}(x, z) = A \sqrt{\frac{2}{\pi}} \frac{1}{w_{in}(z)} \exp\left[-2\frac{x^2}{w_{in}(z)^2}\right] \quad (12)$$

Here, since it is assumed that the laser beam has the intensity distribution represented by Gaussian, the laser beam exhibits the peak power where x=0. From the formulas (11) and (12), the peak power ratio between $P_{in\_tt}(x)$ and $P_{tt}(x,z)$ is expressed by the following formula (13).

$$\frac{P_{tt}(0, z)}{P_{in\_tt}(0)} = \frac{w_{in\_tt}}{w_{in}(0)} \quad (13)$$

Accordingly, when the waveguide length and the waveguide width at the emission end are represented by $L_{tt}$ and $w_{out\_tt}$, respectively, the ratio between the peak power of the incident light and the peak power of the emitted light can be expressed by the following formula (14) as a ratio between waveguide widths.

$$\frac{P_{out\_tt}(0)}{P_{in\_tt}(0)} = \frac{w_{in\_tt}}{w_{out\_tt}} \quad (14)$$

Here, $P_{tt}(x,L_{tt}) = P_{out\_tt}(x)$ and $w_{tt}(L) = w_{out\_tt}$ are set. When the beam width is amplified by M times (M is a given positive actual number) by the taper, the formula (14) shows that the peak power is increased by 1/M times. Further, this relation indicates that, when the laser beam diffuses in the transparent medium, as shown in the following formula (15), the intensity of the laser beam is kept.

$$\frac{\int_{-\infty}^{\infty} P_{out\_tt}(x)dx}{\int_{-\infty}^{\infty} P_{in\_tt}(x)dx} = 1 \quad (15)$$

<4-2. Diffusion in Waveguide Formed Using Amplifying Medium>

Next, diffusion of the laser beam in the amplifying medium will be considered. Here, the propagation of light in a straight waveguide formed using a uniform amplifying medium will be considered. In a manner similar to that of the above model of the transparent medium, in a case where the width direction of the waveguide is set as the x-axis, the length direction of the waveguide is set as the z-axis, the origin of the x-axis is set as the center of the waveguide in the x-axis direction, and the origin of the z-axis is set as the incident end of the waveguide, intensity $P_{in\_as}(x)$ of incident light and intensity $P_{out\_as}(x)$ of emitted light are expressed by the following formula (16).

$$P_{out\_as} = \exp[gL_{as}]P_{in\_as} \quad (16)$$

Here, g represents a gain, and $L_{as}$ represents the waveguide length in the model. Here, the gain g is in proportion to the current density J in the waveguide, and $gL_{as}$ is expressed by the following formula (17).

$$gL_{as} = B_g(J-J_0)L_{as} \quad (17)$$

Here, $B_g$ represents a constant of proportionality, and $J_0$ represents a transparent current density.

Therefore, considering that the waveguide width is constant in this model, from the formulas (14) and (16), with respect to the propagation of light in the straight waveguide formed using the amplifying medium, the relation between the intensity $P_{in\_as}(x)$ of incident light and the intensity $P_{out\_as}(x)$ of emitted light is expressed by the following formula (18).

$$\frac{\int_{-\infty}^{\infty} P_{out\_as}(x)dx}{\int_{-\infty}^{\infty} P_{in\_as}(x)dx} = \exp[gL_{as}] \quad (18)$$

<4-3. Diffusion in Tapered Waveguide Formed Using Amplifying Medium>

Lastly, based on the discussions on the two models (the tapered waveguide formed using the transparent medium and the straight waveguide formed using the amplifying medium), diffusion of the laser beam in the tapered waveguide formed using the amplifying medium will be discussed. From the formula (14), when the waveguide has a tapered shape, the ratio between the intensity of incident light and the intensity of emitted light is represented by the ratio between the waveguide width at the incident end and the waveguide width at the emission end. Therefore, from the formulas (14) and (18), with respect to the propagation of light in the tapered waveguide formed using the amplifying medium, the relation between the intensity $P_{in\_at}(x)$ of incident light and the intensity $P_{out\_at}(x)$ of emitted light is expressed by the following formula (19).

$$\frac{\int_{-\infty}^{\infty} P_{out\_as}(x)dx}{\int_{-\infty}^{\infty} P_{in\_as}(x)dx} = \frac{w_{in\_at}}{w_{out\_at}} \exp[gL_{at}] \quad (19)$$

Here, $w_{in\_at}$, $w_{out\_at}$, and $L_{at}$ represent the waveguide width of the tapered waveguide formed using the amplifying medium at the incident end, the waveguide width of the waveguide at the emission end, and the waveguide length of the waveguide, respectively.

In the above manner, with respect to the three calculation models (the tapered waveguide formed using the transparent medium, the straight waveguide formed using the amplifying medium, and the tapered waveguide formed using the amplifying medium), the ratio between the intensity of incident light and the intensity of emitted light has been formularized. Here, the tapered waveguide formed using the transparent medium corresponds to the diffusing unit waveguide 171 of the SOA 10 according to this embodiment, and the tapered waveguide formed using the amplifying medium corresponds to the amplifying unit waveguide 181 of the SOA 10 according to this embodiment. Accordingly, it can be said that the formula (14) shows properties of the laser beam in the diffusing unit 170 and the formula (19) shows properties of the laser beam in the amplifying unit 180.

By replacing the symbols of the parameters in the formulas (14) and (19) with the symbols shown in FIG. 4B, the following formulas (20) and (21) are obtained. Here, $P_{in\_D}(x)$, $P_{out\_D}(x)$, $P_{in\_A}(x)$, and $P_{out\_A}(x)$ represent the intensity of light incident on the diffusing unit 170, the intensity of light emitted from the diffusing unit 170, the intensity of light incident on the amplifying unit 180, and the intensity of light emitted from the amplifying unit 180, respectively.

$$P_{out\_D}(x) = \frac{w_{in}}{w_{out\_dif}} P_{in\_D}(x) \qquad (20)$$

$$P_{out\_A}(x) = \frac{w_{out\_dif}}{w_{out}} \exp[gL_A] P_{in\_A}(x) \qquad (21)$$

Here, when the intensity of light incident on the SOA 10 is represented by $P_{in}(x)$ and the intensity of light emitted from the SOA 10 is represented by $P_{out}(x)$, $P_{in}(x)=P_{in\_D}(x)$ and $P_{out}(x)=P_{out\_A}(x)$ are set. Further, since $P_{out\_D}(x)=P_{in\_A}(x)$ is set, from the formulas (20) and (21), the relation between the intensity $P_{in}(x)$ of incident light and the intensity $P_{out}(x)$ of emitted light in the SOA 10 is expressed by the following formula (22).

$$\begin{aligned} P_{out}(x) &= \frac{w_{out\_dif}}{w_{out}} \frac{w_{in}}{w_{out\_dif}} \exp[gL_A] P_{in}(x) \\ &= \frac{w_{in}}{w_{out}} \exp[gL_A] P_{in}(x) \end{aligned} \qquad (22)$$

Here, it is known that the gain g is saturated at a predetermined value (gain saturation occurs) in a case where the light density S is increased. Therefore, in the formula (22), approximation is conducted considering the saturation of the gain g. As described in the above <3-2. Optical propagation simulation>, the gain g is expressed by the formula (10). Here, considering $|\phi(x,z,t)|^2$ being intensity $P(x,z,t)$ of the laser beam in the waveguide 160 and the change in the intensity $P(x,z,t)$ only in the z-axis direction, the following formula (23) is obtained from the formula (10).

$$\frac{dP}{dz} = gP = \frac{1}{1 + \frac{\tau_g P}{E_{sat}}} g_0 P \qquad (23)$$

Here, the coefficient part of $g_0 P(x,z,t)$, which is $1/(1+\tau_g P(x,z,t)/E_{sat})$, in the formula (23) is converged to be about 0.62 in a case where $P(x,z,t) \to \infty$, considering that $\tau_g$ and $E_{sat}$ are constants. Therefore, when the light density S is sufficiently high (when $P(x,z,t)$ is sufficiently large), the following formula (24) is satisfied.

$$g \approx 0.62 g_0 \qquad (24)$$

The formula (24) shows that the gain g is only increased by about 0.62 times a small signal gain $g_0$ in a case where the light density S is sufficiently high. By replacing $\exp(gL_A)$ in the formula (22) with $\exp(0.62 g L_A)$ with reference to this relation, a good approximation considering the gain saturation can be obtained as shown in the following formula (25).

$$P_{out}(x) \approx \frac{w_{in}}{w_{out}} \exp[0.62 g L_A] P_{in}(x) \qquad (25)$$

From the above discussions, finally, it is found that the relation between the intensity $P_{in}(x)$ of incident light and the intensity $P_{out}(x)$ of emitted light in the SOA 10 can be expressed by the formula (25). In the following description, by using the formula (25), conditions expected for the taper angle θ of the waveguide 160, the length $L_A$ of the amplifying unit waveguide 181, and the amplifying unit current density $J_A$, in the SOA 10, will be shown.

Considering the peak power ($P_{in}(0)$) of incident light and the peak power ($P_{out}(0)$) of emitted light in the SOA 10, the minimum performance expected for the SOA 10 is that the peak power does not decrease, that is, $P_{in}(0) \leq P_{out}(0)$. When the relation of the peak power is expressed by the formula (25), as conditions expected for the SOA 10, the following formula (26) can be obtained.

$$\frac{w_{in}}{w_{out}} \exp[0.62 g L_A] \leq 1 \qquad (26)$$

Further, from the geometric relation in the waveguide 160 with reference to FIG. 4B, a relation shown in the following formula (27) is obtained among the taper angle θ, the length $L_A$ of the amplifying unit waveguide 181, the waveguide width $w_{out\_dif}$ on the incident side of the amplifying unit waveguide 181, and the waveguide width $w_{out}$ on the emission side of the amplifying unit waveguide 181. Here, by regarding the taper angle θ as being sufficiently small, an approximation in which $\tan\theta \approx \theta(\text{rad})$ is used.

$$w_{out} = w_{out\_dif} + 2 L_A \theta \qquad (27)$$

By using the formulas (26) and (27), the relation among the parameters related to the waveguide 160 of the SOA 10 can be obtained. Specifically, from the formulas (26) and (27), the taper angle θ of the waveguide 160 can be decided based on the length $L_A$ of the amplifying unit waveguide 181, the cross-sectional area of the amplifying unit waveguide 181 (in a two-dimensional space, the waveguide width $w_{out\_dif}$ on the incident side of the amplifying unit waveguide 181 and the waveguide width $w_{out}$ on the emission side of the amplifying unit waveguide 181), and the amplifying rate $\exp(0.62 g L_A)$ of the intensity of the laser beam in the amplifying unit 180.

Results of calculation of the taper angle θ of the waveguide 160 using the formulas (26) and (27) are shown in FIG. 12. FIG. 12 is a table showing examples of parameters for designing the shape of the waveguide 160 in the SOA 10 according to this embodiment. FIG. 12 shows the results of calculation of a minimum $\theta_{min}$ of the taper angle θ by using the formulas (26) and (27) and using the waveguide width $w_{in}$ on the incident side of the diffusing unit waveguide 171, the amplifying unit current density $J_A$, the waveguide width $w_{out\_dif}$ on the incident side of the amplifying unit waveguide 181, and the length $L_A$ of the amplifying unit waveguide 181 as parameters, as an example of a method to decide the taper angle θ of the waveguide 160. Note that in a case where the values in FIG. 12 are obtained, the value of the gain g is calculated from the formula (17). Further, from the measurement results in the SOA 10, $B_g$=10.8 (cm/kA) and $J_0$=2.0 (kA/cm$^2$) are set.

As shown in FIG. 12, for example, by changing the values of $J_A$, $w_{out\_dif}$, and $L_A$ as parameters, based on the formulas (26) and (27), the conditions expected for the shape of the waveguide 160 of the SOA 10 can be designed. For example, according to FIG. 12, when $J_A$=4 (kA/cm$^2$), $w_{out\_dif}$=1.5 (μm), and $L_A$=0.35 (cm), the taper angle θ is 0.82 (deg) and the amplifying rate $\exp(0.62 g L_A)$ can be 100 or more. Note that the amplifying unit waveguide length $L_A$ has an influence on the entire size of the SOA 10 and thus may be decided in accordance with arrangement with peripheral optical members when the SOA 10 is incorporated in a variety of laser light source systems, for example.

Note that a maximum of the taper angle θ may be decided based on the diffraction limit in accordance with the wavelength of the laser beam to be amplified. As seen in the above-described intensity distribution measurement of the laser beam in the SOA 30 for testing, shown in FIGS. 7A and 7B, there is a limit on diffusion of the laser beam, and it is considered that the limit of an increase in the beam width is defined by the diffraction limit in accordance with the wavelength of the laser beam. Therefore, the maximum of the taper angle θ of the waveguides 160 and 360 may be smaller than or equal to an angle that is defined by the diffraction limit.

A method for designing the shape of the waveguide 160 in the SOA 10 has been described above. According to this method, the shape of the waveguide 160 in the SOA 10 can be designed based on the formulas (26) and (27). Further, by combining this method with the simulation technique described in <3-2. Optical propagation simulation> above, the shape of the waveguide 160 in the SOA 10 can be designed more efficiently.

Note that the above description of the designing method has been made by focusing on the various physical amounts on the x-z plane on the assumption that the thickness of the waveguide 160 is constant in the y-axis direction. However, this embodiment is not limited to this example and the above description can be applied to a three-dimensional space. For example, by considering the y-coordinate in the formulas shown in the description of the designing method, a similar designing method can be established in a three-dimensional space. Further, for example, the waveguide 160 may have not only a two-dimensional tapered shape but also a three-dimensional tapered shape, i.e., a conic shape. When the waveguide 160 has a conic shape, the study on the beam width in the above description will be applied to the beam diameter so that the same conclusion can be obtained.

<5. Modification Example and Application Example>

Here, a modification example of the SOA 10 according to this embodiment and an example thereof applied to an optic system will be described.

<5-1. Structure Having Different Taper Angles>

First, as one modification example of the SOA 10, another structural example of the SOA according to this embodiment, obtained by combining the simulation technique described in <3-2. Optical propagation simulation> above and the designing method described in <4. Method for designing SOA> above, will be described.

A structure of the SOA according to this modification example will be described with reference to FIG. 13. FIG. 13 is a schematic diagram showing the structure of the SOA according to one modification example of this embodiment. A stack structure of the SOA according to this modification example shown in FIG. 13 is the same as the stack structure of the SOA 10 described with reference to FIG. 4A; therefore, a description of the stack structure of the SOA according to this modification example will be omitted below. Further, FIG. 13 corresponds to FIG. 4B and FIG. 6 and schematically shows the structure of the SOA according to this modification example when seen from a top direction in which semiconductor layers are stacked. A waveguide is shown by hatching.

Referring to FIG. 13, among structural members of an SOA 20 for testing according to this modification example, only an n-type cladding layer 230 and an active layer 210 (a waveguide 260) are shown. Note that, as described above, since the SOA 20 has the same stack structure as the SOA 10 shown in FIG. 4A, the SOA 20 has other structures that are not shown in FIG. 13, such as a p-type cladding layer, a lower electrode, and an upper electrode (including a diffusing unit electrode and an amplifying unit electrode). As shown in FIG. 13, the SOA 20 for testing according to this modification example includes a diffusing unit 270 and an amplifying unit 280. Further, a waveguide 260 is divided into a diffusing unit waveguide 271 included in the diffusing unit 270 and an amplifying unit waveguide 281 included in the amplifying unit 280. Further, the diffusing unit waveguide 271 includes a straight portion 272 in which the width of the diffusing unit waveguide 271 is substantially constant and a tapered portion 273 having a tapered shape in which the cross-sectional area of the diffusing unit waveguide 271 is gradually increased toward the travelling direction of the laser beam. Here, functions and the structure of the SOA 20 are the same as those of the SOA 10 except for the shape of the waveguide 260 (including the diffusing unit waveguide 271 and the amplifying unit waveguide 281); therefore, a detailed description of the same structures will be omitted and differences will be mainly described below. Further, the structure of the SOA 20 will be described by using the same symbols representing the dimensions used in FIG. 4B.

As shown in FIG. 13, the SOA 20 according to this modification example corresponds to the SOA 10 shown in FIGS. 4A and 4B in which the dimensions of $w_{out}$, $w_{out\_dif}$, $L_D$, $L_{DS}$, $L_{DT}$, $L_A$, and θ are changed. Specifically, the dimensions in the SOA 20 are as follows: $w_{out} \approx 150$ (μm), $w_{out\_dif} \approx 40$ (μm), $L \approx 3000$ (μm), $L_D \approx 1500$ (μm), $L_{DS} \approx 1000$ (μm), $L_{DT} \approx 500$ (μm), $L_A \approx 1000$ (μm), and $\theta \approx 2.1$ (deg). In this manner, the SOA 20 corresponds to the SOA 10 in which the taper angle θ of the diffusing unit waveguide 271 is increased.

The structure of the SOA 20 according to this modification example, in particular, the shape of the waveguide 260, has been described above with reference to FIG. 13. In order to confirm properties of the SOA 20 having such a shape, numeric calculation is performed on the SOA 20 using the simulation technique described in <3-2. Optical propagation simulation> above. The results of the simulation are shown in FIGS. 14A to 14C and 15.

Figure 14A:
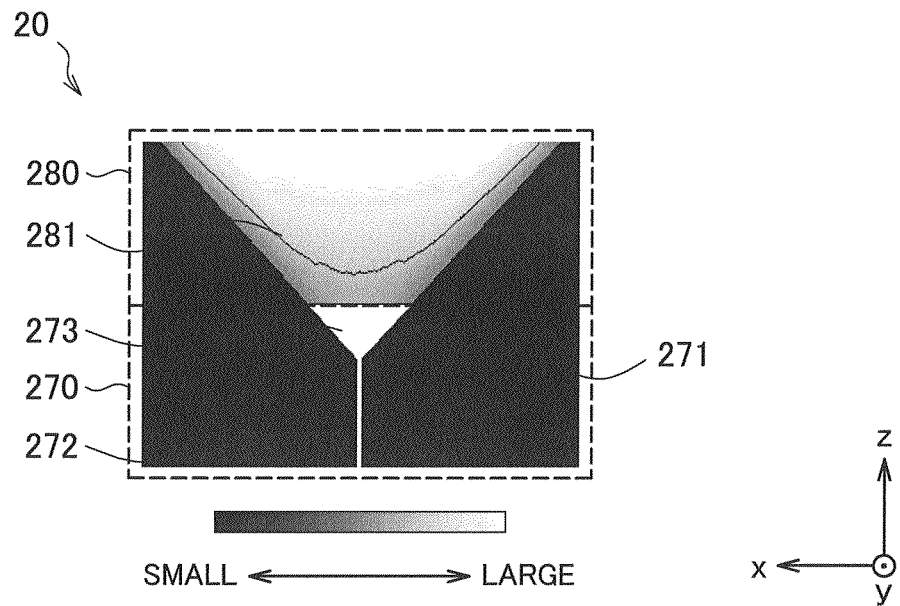
FIG. 14A is a contour drawing showing values of an SOA according to a modification example in a real part of a complex dielectric constant at respective coordinates obtained through simulation.
Figure 14B:
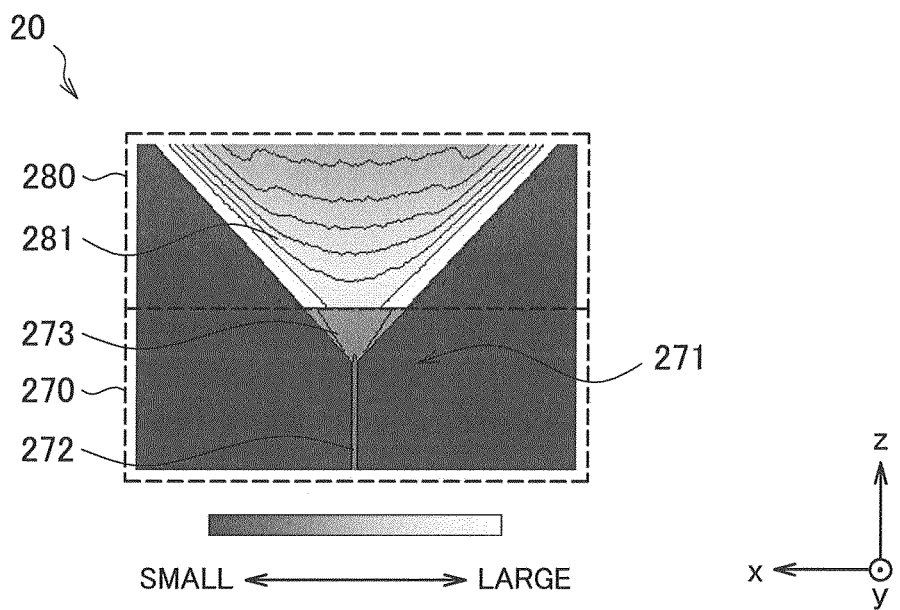
FIG. 14B is a contour drawing showing values of an SOA according to a modification example in an imaginary part of a complex dielectric constant at respective coordinates obtained through simulation.
Figure 14C:
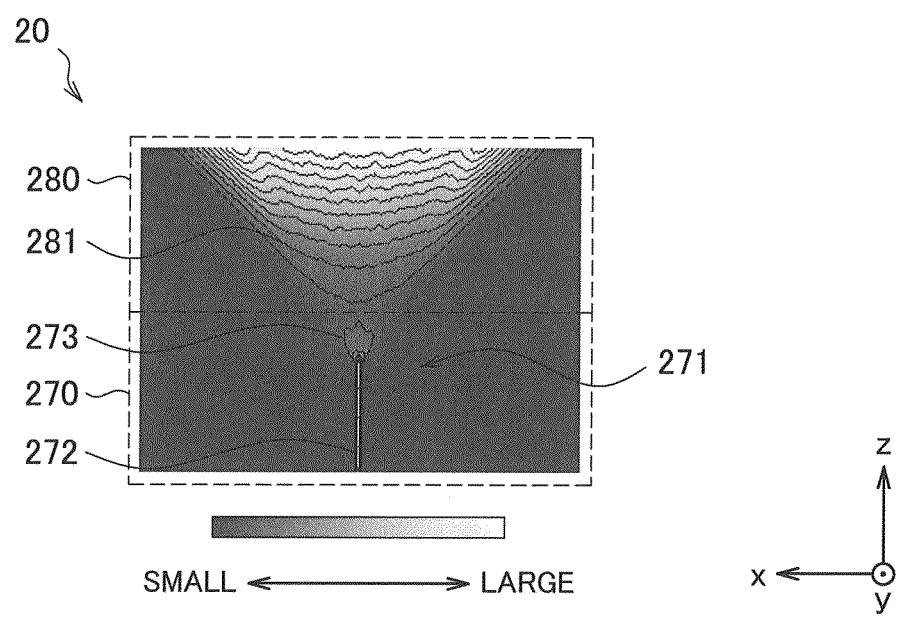
FIG. 14C is a contour drawing showing values of light intensity of an SOA according to a modification example at respective coordinates obtained through simulation.
Figure 15:
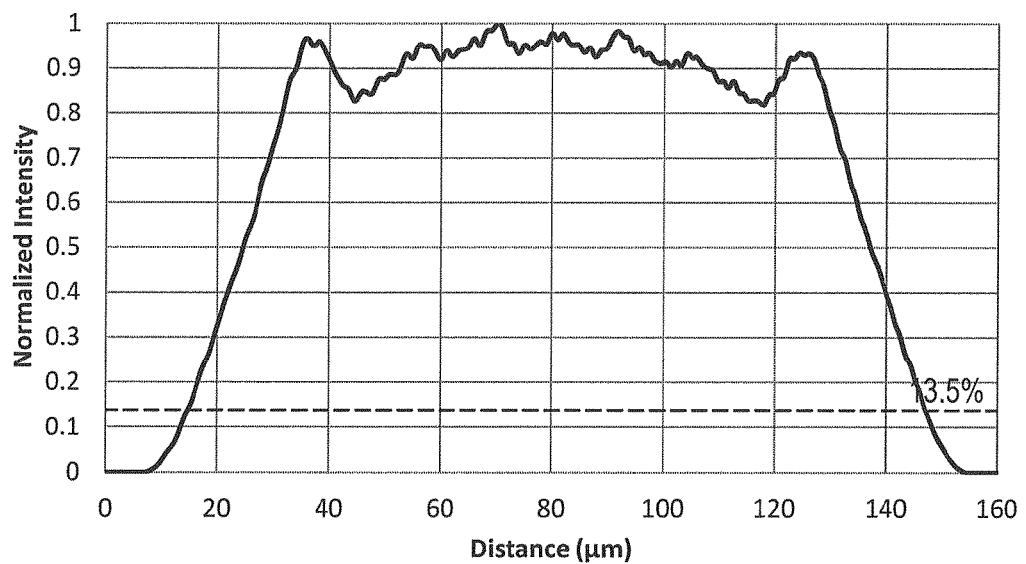
FIG. 15 is a graph showing intensity distribution of a laser beam in an x-axis direction in a position corresponding to an emission end shown in FIG. 14C.

FIGS. 14A to 14C are each a contour drawing in which each physical amount of the SOA 20, obtained through simulation, is plotted on the x-z plane, and correspond to the above FIGS. 10A to 10C showing the simulation results of the SOA 10 described in <3-3. Results of optical propagation simulation> above. The contour drawing in FIG. 14A shows values of the SOA 20 according to this modification example in a real part of the complex dielectric constant at the respective coordinates obtained through simulation. The contour drawing in FIG. 14B shows values of the SOA 20 according to this modification example in an imaginary part of the complex dielectric constant at the respective coordinates obtained through simulation. The contour drawing in FIG. 14C shows values of light intensity of the SOA 20 according to this modification example at the respective coordinates obtained through simulation. FIG. 15 is a graph showing intensity distribution of the laser beam in the x-axis direction in a position corresponding to the emission end shown in FIG. 14C. Note that the results shown in FIGS. 14A to 14C and 15 are results obtained by performing simulation under same conditions for simulation of the SOA 10 shown in FIGS. 10A to 10C and 11.

Referring to FIG. 14A, it is found that, in the amplifying unit 280 of the SOA 20, the value in the real part of the complex dielectric constant (i.e., the index representing the refractive index of the medium of the waveguide 260) becomes larger near the center of the waveguide 260 in the x-axis and smaller near the boundary between the waveguide 260 and other peripheral layers, as in the results of the SOA 10 shown in FIG. 10A. Meanwhile, referring to FIG. 14B, it is found that, in the amplifying unit 280 of the SOA 20, the value in the imaginary part of the complex dielectric constant (i.e., the index representing the amplifying rate of the medium of the waveguide 260) becomes smaller near the center of the waveguide 260 in the x-axis and larger near the boundary between the waveguide 260 and other peripheral layers, as in the results of the SOA 10 shown in FIG. 10B. Further, referring to FIG. 14C, it is found that, in intensity distribution of light in the amplifying unit 280 of the SOA 20, a region with high intensity is not concentrated near the center of the waveguide 260 in the x-axis, and regions with substantially the same intensity are diffused in the x-axis direction, unlike in the results of the SOA 10 shown in FIG. 10C. These results indicate that, in the amplifying unit 280 of the SOA 20, the effects of diffusing the laser beam appear more markedly by making the taper angle θ larger than that in the SOA 10.

FIG. 15 shows intensity distribution of the laser beam in the x-axis direction at a position corresponding to the emission end shown in FIG. 14C. In FIG. 15, the form (physical amounts represented by the vertical axis and the horizontal axis, definition of the beam width, and the like) of the graph is the same as that in FIG. 11; therefore, a detailed description thereof will be omitted. Referring to FIG. 15, the beam width at the emission end of the SOA 20, obtained through simulation, is about 135 (μm). These results show that narrowing of the beam width is further suppressed by increasing the taper angle θ. Further, when the amplifying rate $\exp(0.62gL_A)$ of the SOA 20 is calculated, a high value of 135 is obtained as the amplifying rate.

The behavior of light in the waveguide 260 of the SOA 20 according to this modification example has been described above with reference to FIGS. 14A to 14C and 15. As described above, in the SOA 20 according to this modification example, the taper angle θ of the waveguide 260 is set to be larger than that in the SOA 10 according to this embodiment. Accordingly, the laser beam can be further diffused in the diffusing unit 270 and narrowing of the beam width can be further suppressed even when the laser beam is amplified in the amplifying unit 280.

<5-2. Application to MOPA>

Next, an application example where the above-described SOAs 10 and 20 according to this embodiment are applied to an optical system. Note that although the following description of the application example will be made by taking the SOA 10 according to this embodiment as an example, the application example is not limited to this example. The application example can also be applied to an SOA having another structure as long as the SOA is the SOA according to this embodiment.

A master oscillator power amplifier (MOPA) system will be described as an example of the optical system to which the SOA 10 is applied with reference to FIG. 16. The MOPA system refers to a system in which a mode-locked laser diode (MLLD) in which a semiconductor laser is operated as an external resonator is used as a master laser to amplify the power of the mode-locked laser diode with a semiconductor optical amplifier (SOA).

Figure 16:
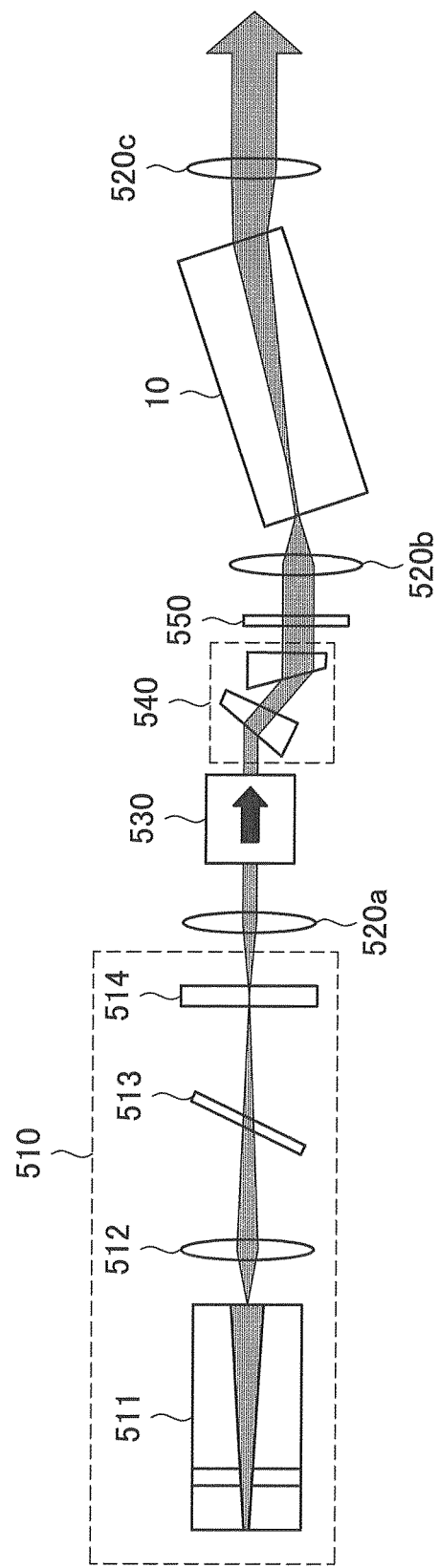
FIG. 16 is a schematic diagram showing one structural example of a MOPA system including an SOA according to an embodiment.

FIG. 16 is a schematic diagram showing one structural example of the MOPA system including the SOA 10 according to this embodiment. Referring to FIG. 16, a MOPA system 50 includes a mode-locked oscillator 510, lenses 520a, 520b, and 520c, an isolator 530, a prism pair 540, a λ/2 plate 550, and the SOA 10 according to this embodiment. Note that in FIG. 16, as an example of the MOPA system 50, a structure of the MOPA system 50 that outputs a blue pulsed laser beam is shown. However, the MOPA system 50 according to this embodiment is not limited to the MOPA system that outputs a blue pulsed laser beam, and may output a pulsed laser beam of other wavelength bands. Further, in a case where the MOPA system 50 outputs a pulsed laser beam of other wavelength bands, optical properties of the structural members included in the MOPA system 50 may be adjusted as appropriate in accordance with the wavelength band of the output pulsed laser beam.

The mode-locked oscillator 510 oscillates the output of the semiconductor laser that emits light having a predetermined wavelength with an oscillating structure, thereby emitting a pulsed laser beam. The mode-locked oscillator 510 includes a laser diode 511, a collimator lens 512, a band pass filter (BPF) 513, and an output mirror 514.

The laser diode 511 is, for example, a bisectional-laser diode (BS-LD) formed using GaInN as a main material. Further, the laser diode 511 functions as the above MLLD and can emit a pulsed laser beam having a wavelength band of from about 350 nm to about 500 nm, for example.

The pulsed laser beam emitted from the laser diode 511 passes through the collimator lens 512, the band pass filter 513, and the output mirror 514 to be emitted from the mode-locked oscillator 510. Note that the wavelength of the pulsed laser beam emitted from the mode-locked oscillator 510 is adjusted to be about 405 nm, for example, by the band pass filter 513.

The pulsed laser beam emitted from the laser diode 511 passes through the lens 520a, the isolator 530, the prism pair 540, the λ/2 plate 550, and the lens 520b in this order, which are provided in a latter stage, to be incident on the SOA 10 according to this embodiment. The λ/2 plate 550 adjusts the polarization direction of the pulsed laser beam. Further, by passing through the prism pair 540, the pulsed laser beam incident on the SOA 10 has higher coupling efficiency. The pulsed laser beam amplified by the SOA 10 is output outside through the lens 520c.

The structural example of the MOPA system 50 has been described above as an example of the optical system to which the SOA 10 according to this embodiment is applied, with reference to FIG. 16. Application of the SOA 10 according to this embodiment to the MOPA system 50 makes it possible to amplify the intensity of the pulsed laser beam whose narrowing of the beam width is suppressed. Accordingly, it is possible to obtain the pulsed laser beam whose intensity is amplified to a high value more stably as the output light from the MOPA system 50. Therefore, the MOPA system 50 has higher performance.

Although the above description has been made by taking the MOPA system 50 as the example of the optical system to which the SOA 10 according to this embodiment is applied, an optical system to which the SOA 10 according to this embodiment is applied is not limited to this example. The SOA 10 according to this embodiment can be applied to various known optical systems having a function of amplifying the intensity of a laser beam.

<6. Conclusion>

As described above, according to this embodiment, the following effects can be obtained.

With the SOAs 10 and 20 according to this embodiment, the diffusion units 170 and 270 diffuse the laser beam and then the amplifying units 180 and 280 amplify the intensity of the laser beam. Accordingly, the SOAs 10 and 20 according to this embodiment can further suppress narrowing of the width of the laser beam even when the peak power of the laser beam is amplified to substantially the same level as the existing SOA 910 for example. In this manner, the SOAs 10 and 20 according to this embodiment make it possible to amplify the intensity of the laser beam more stably.

Further, the novel optical propagation simulation technique involving the carrier-induced refractive index change is developed. This simulation technique can visualize the behavior of the laser beam in the waveguides 160 and 260 of the SOAs 10 and 20 according to this embodiment. Further, the analysis using the simulation technique has led to the knowledge that the light density S has a significant influence on the change in the refractive index in the waveguides 160 and 260.

In view of this knowledge, the existing SOA 910 can be regarded as having a structure in which the diffusing unit and the amplifying unit are integrally formed. Therefore, a sufficient amplifying rate cannot be obtained when the light density is decreased in order to suppress the converging phenomenon, and the converging phenomenon cannot be suppressed when the amplifying rate is increased because the light density is increased. That is, with the existing SOA 910, it has been difficult to accomplish both a high amplifying rate and suppression of narrowing of the beam width. In contrast, in the SOAs 10 and 20 according to this embodiment, the waveguides 160 and the 260 are divided into the diffusing units 170 and 270 and the amplifying units 180 and 280. In the diffusing units 170 and 270, the diffusing unit current density $J_D$ is controlled such that the intensity of the laser beam is not amplified. Therefore, the light density S in the diffusing units 170 and 270 is kept low and the change in the refractive index in the diffusing units 170 and 270, i.e., the converging phenomenon (narrowing of the beam width), is suppressed. Thus, the laser beam is diffused efficiently in the diffusing units 170 and 270.

Further, the designing method for deciding the shape of the waveguides 160 and 260 in the SOAs 10 and 20 according to this embodiment is described. The designing method enables designing of an SOA having another structure according to this embodiment. For example, by using the designing method, it becomes possible to decide the taper angle θ of the waveguides 160 and 260 based on the length $L_A$ of the amplifying unit waveguides 181 and 281, the cross-sectional area of the amplifying unit waveguides 181 and 281 (in a two-dimensional space, the waveguide width $w_{out\_dif}$ on the incident side of the amplifying unit waveguides 181 and 281 and the waveguide width $w_{out}$ on the emission side of the amplifying unit waveguides 181 and 281), and the amplifying rate $\exp(0.62gL_A)$ of the intensity of the laser beam in the amplifying units 180 and 280.

Furthermore, by combining the simulation technique and the designing method according to this embodiment, it becomes possible to design an SOA having another structure according to this embodiment more efficiently.

Although preferred embodiments of the present disclosure are described in detail with reference to the accompanying drawings, the technical scope of the present disclosure is not limited thereto. It should be understood by those skilled in the art that various modifications, combinations, sub-combinations and alterations may occur depending on design requirements and other factors insofar as they are within the scope of the appended claims or the equivalents thereof.

For example, although the above embodiment shows the functions and the structures of the SOA in which the blue laser beam (for example, the laser beam having the wavelength band of from about 350 nm to about 500 nm) is amplified, the present technology is not limited to this example. For example, the wavelength of the laser beam amplified by the SOA according to this embodiment may be in any wavelength band other than the above-described blue band. In this case, the structural members of the SOA may be selected and adjusted as appropriate so as to have optical properties in accordance with the wavelength band of the laser beam to be amplified.

Furthermore, the embodiment is described by focusing on the physical amounts on the x-z plane on the assumption that the thickness of the waveguides 160 and 260 is constant in the y-axis direction. However, the embodiment is not limited to this example, and can be applied to a three-dimensional space. For example, in this embodiment, the waveguides 160 and 260 may have not only a two-dimensional tapered shape but also a three-dimensional tapered shape, i.e., a conic shape. Further, for example, by considering the y-coordinate in the formulas shown in <3-2. Optical propagation simulation> and <4. Method for designing SOA>, a similar simulation technique and a similar designing method can be established in a three-dimensional space. When this embodiment is applied to a three-dimensional space, the description of the beam width in the embodiment will be applied to the beam diameter, and the same results and effects as the embodiment in a two-dimensional space can be obtained in the embodiment in the three-dimensional space.

Additionally, the present technology may also be configured as below.

(1) An optical amplifier including:

a diffusing unit configured to be driven by a first current density and to increase a beam diameter of an incident laser beam that passes through a first waveguide that guides the laser beam; and an amplifying unit configured to be driven by a second current density that is higher than the first current density and to amplify intensity of the laser beam that passes through a second waveguide that guides the laser beam whose beam diameter has been increased by the diffusing unit, wherein the first waveguide of the diffusing unit has a tapered shape in which a cross-sectional area of the first waveguide is gradually increased toward a travelling direction of the laser beam.

(2) The optical amplifier according to (1), wherein a cross-sectional area of the second waveguide of the amplifying unit is larger than the cross-sectional area of the first waveguide of the diffusing unit.

(3) The optical amplifier according to (1) or (2), wherein the second waveguide of the amplifying unit has a tapered shape in which the cross-sectional area of the second waveguide is gradually increased toward the travelling direction of the laser beam.

(4) The optical amplifier according to any one of (1) to (3), wherein the first waveguide and the second waveguide each have a constant thickness with respect to a first direction that is vertical to the travelling direction of the laser beam, wherein the first waveguide of the diffusing unit has the tapered shape on a plane that intersects with the first direction, and wherein the diffusing unit increases a beam width of the laser beam that passes through the first waveguide in a second direction that is vertical to the travelling direction of the laser beam and to the first direction.

(5) The optical amplifier according to any one of (1) to (4), wherein a taper angle in the tapered shape of the first waveguide of the diffusing unit is decided based on a length of the second waveguide of the amplifying unit, a cross-sectional area of the second waveguide of the amplifying unit, and an amplifying rate of the intensity of the laser beam in the amplifying unit.

(6) The optical amplifier according to any one of (1) to (5), wherein the taper angle in the tapered shape of the first waveguide of the diffusing unit is greater than 0° and less than or equal to an angle defined by a diffraction limit of the laser beam.

(7) The optical amplifier according to (5), wherein the amplifying rate is a ratio of intensity of light emitted from the optical amplifier to intensity of light on the optical amplifier.

(8) The optical amplifier according to any one of (1) to (7), wherein the diffusing unit is driven by the first current density in a manner that the intensity of the laser beam is not amplified in the diffusing unit.

(9) The optical amplifier according to any one of (1) to (8), wherein the first current density is lower than or equal to 3 kA/cm$^2$.

(10) The optical amplifier according to any one of (1) to (9), wherein the laser beam has a wavelength of from 350 nm to 500 nm.

(11) The optical amplifier according to any one of (1) to (10), wherein the first waveguide and the second waveguide each contain a material mainly containing GaInN.

(12) An optical amplifying method including:
increasing a beam diameter of an incident laser beam that passes through a first waveguide that guides the laser beam, by applying a first current density to the first waveguide; and
amplifying intensity of the laser beam that passes through a second waveguide that guides the laser beam whose beam diameter has been increased, by applying, to the second waveguide, a second current density that is higher than the first current density,
wherein the first waveguide has a tapered shape in which a cross-sectional area of the first waveguide is gradually increased toward a travelling direction of the laser beam.

What is claimed is:

1. An optical amplifier comprising:
a diffusing unit configured to be driven by a first current density and to increase a beam diameter of an incident laser beam that passes through a first waveguide that guides the laser beam; and
an amplifying unit configured to be driven by a second current density that is higher than the first current density and to amplify intensity of the laser beam that passes through a second waveguide that guides the laser beam whose beam diameter has been increased by the diffusing unit,
wherein the first waveguide of the diffusing unit has a tapered shape in which a cross-sectional area of the first waveguide is gradually increased toward a travelling direction of the laser beam.

2. The optical amplifier according to claim 1, wherein a cross-sectional area of the second waveguide of the amplifying unit is larger than the cross-sectional area of the first waveguide of the diffusing unit.

3. The optical amplifier according to claim 2, wherein the second waveguide of the amplifying unit has a tapered shape in which the cross-sectional area of the second waveguide is gradually increased toward the travelling direction of the laser beam.

4. The optical amplifier according to claim 1, wherein the first waveguide and the second waveguide each have a constant thickness with respect to a first direction that is vertical to the travelling direction of the laser beam,
wherein the first waveguide of the diffusing unit has the tapered shape on a plane that intersects with the first direction, and
wherein the diffusing unit increases a beam width of the laser beam that passes through the first waveguide in a second direction that is vertical to the travelling direction of the laser beam and to the first direction.

5. The optical amplifier according to claim 1, wherein a taper angle in the tapered shape of the first waveguide of the diffusing unit is decided based on a length of the second waveguide of the amplifying unit, a cross-sectional area of the second waveguide of the amplifying unit, and an amplifying rate of the intensity of the laser beam in the amplifying unit.

6. The optical amplifier according to claim 5, wherein the taper angle in the tapered shape of the first waveguide of the diffusing unit is greater than 0° and less than or equal to an angle defined by a diffraction limit of the laser beam.

7. The optical amplifier according to claim 5, wherein the amplifying rate is a ratio of intensity of light emitted from the optical amplifier to intensity of light on the optical amplifier.

8. The optical amplifier according to claim 1, wherein the diffusing unit is driven by the first current density in a manner that the intensity of the laser beam is not amplified in the diffusing unit.

9. The optical amplifier according to claim 8, wherein the first current density is lower than or equal to 3 kA/cm$^2$.

10. The optical amplifier according to claim 1, wherein the laser beam has a wavelength of from 350 nm to 500 nm.

11. The optical amplifier according to claim 1, wherein the first waveguide and the second waveguide each contain a material mainly containing GaInN.

12. An optical amplifying method comprising:
increasing a beam diameter of an incident laser beam that passes through a first waveguide that guides the laser beam, by applying a first current density to the first waveguide; and
amplifying intensity of the laser beam that passes through a second waveguide that guides the laser beam whose beam diameter has been increased, by applying, to the second waveguide, a second current density that is higher than the first current density,
wherein the first waveguide has a tapered shape in which a cross-sectional area of the first waveguide is gradually increased toward a travelling direction of the laser beam.

* * * * *